United States Patent
Adachi

(10) Patent No.: US 7,479,675 B2
(45) Date of Patent: Jan. 20, 2009

(54) SOLID-STATE IMAGE PICKUP DEVICE AND MANUFACTURING METHOD THEREOF

(75) Inventor: Satoru Adachi, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/763,523

(22) Filed: Jun. 15, 2007

(65) Prior Publication Data

US 2007/0290241 A1 Dec. 20, 2007

(51) Int. Cl.
*H01L 31/062* (2006.01)
(52) U.S. Cl. .............. 257/292; 257/291; 257/293; 257/E27.133
(58) Field of Classification Search ............ 257/291, 257/292, 293, E27.133
See application file for complete search history.

(56) References Cited

U.S. PATENT DOCUMENTS

2006/0001061 A1* 1/2006 Miyatake et al. ............ 257/292
2006/0065915 A1* 3/2006 Kuwazawa ................ 257/292

* cited by examiner

*Primary Examiner*—Evan Pert
*Assistant Examiner*—Tan Tran
(74) *Attorney, Agent, or Firm*—William B. Kempler; W. James Brady, III; Frederick J. Telecky, Jr.

(57) ABSTRACT

A solid-state image pickup device that can suppress the dark current with respect to the photo-electrons overflowing from the photodiode, as well as its manufacturing method. Each pixel has the following parts: photodiode, transfer transistor, floating diffusion, accumulating capacitive element, and accumulating transistor. At least one of said source/drain regions that form accumulating transistor is formed as follows: first semiconductor layer 11a of the first electroconductive type divided by element separating insulating film 40 formed on the active region of the semiconductor substrate, second semiconductor layer 42 of the first electroconductive type is formed in the first silicide layer, and a joint plane is formed with the second semiconductor layer as third silicide layer 15 of the second electroconductive type is formed on the outer layer portion of the first silicide layer, so that the depletion layer that extends from the joint plane when the solid-state image pickup device is turned ON does not reach the side surface of the element separating insulating film.

10 Claims, 13 Drawing Sheets

SOLID-STATE IMAGE PICKUP DEVICE AND MANUFACTURING METHOD THEREOF

FIELD OF THE INVENTION

The present invention pertains to a type of solid-state image pickup device and its manufacturing method. In particular, the present invention pertains to a CMOS type or CCD type of solid-state image pickup device and its manufacturing method.

BACKGROUND OF THE INVENTION

As the characteristics of CMOS (Complementary Metal-Oxide-Semiconductor) image sensors, CCD (Charge Coupled Device) image sensors, and other image input sensors have improved, the demand for them in applications such as digital cameras and camera-equipped cell phones has increased.

There is a need for further improvement of the characteristics of said image sensors, such as an expansion of their dynamic range.

For example, Japanese Kokai Patent Application No. 2003-134396, Japanese Kokai Patent Application No. 2000-165754, Japanese Kokai Patent Application No. 2002-77737 and Japanese Kokai Patent Application No. Hei 5[1993]-90556 have disclosed solid-state image pickup devices that have realized a wider dynamic range. In these solid-state image pickup devices, however, it is difficult to realize a wider dynamic range while maintaining a high sensitivity and a high S/N ratio. In order to solve this problem, Patent Reference 5 has disclosed a type of solid-state image pickup device.

The solid-state image pickup device described in Japanese Kokai Patent Application No. 2005-328493 is structured such that the photoelectric charge overflowing from the photodiode of each pixel is accumulated in the floating diffusion and electrostatic capacitive element. The signal for each pixel is obtained from the photo-electrons in the diode when the photo-electrons do not overflow, or by both the photo-electrons in the photodiode and the photodiodes overflowing from the photodiode when said photo-electrons overflow from the photodiode.

However, when the solid-state image pickup device described in Japanese Kokai Patent Application No. 2005-328493 is manufactured in a CMOS process, the dark current component with respect to the photo-electrons overflowing from the photodiode increases by 3-4 orders of magnitude over the desired level. This is undesirable for use in accumulating photoelectric charge over a long time, and there is a need to suppress this phenomenon. The sites for generation of the dark current component include the interface immediately below the gate of the transistor, the side surface of the element separating insulating film, the portion in touch with the depletion layer on the silicon surface, etc.

A general object of the invention is to address the difficulty of suppressing the dark current component with respect to the photo-electrons overflowing from photodiode in a solid-state image pickup device with a wide dynamic range.

SUMMARY OF THE INVENTION

This and other objects and features are obtained, in accordance with an aspect of the present invention by solid-state image pickup device characterized by the following facts: it has plural pixels integrated in array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is set via said transfer transistor to said photodiode, and accumulates the photoelectric charge overflowing from said photodiode in the accumulating operation via said transfer transistor, and an accumulating transistor that connects or divides the potentials of said floating diffusion and said accumulating capacitive element, with one source/drain region becoming said floating diffusion and with the other source/drain region connected to said accumulating capacitive element; in at least one of said source/drain regions that form said accumulating transistor, there are the following layers: a first semiconductor layer of the first electroconductive type that is formed in the active region of said semiconductor substrate and is divided by the element separating insulating film, a second semiconductor layer of the first electroconductive type formed in said first semiconductor layer such that at least the side surface of said element separating insulating film is covered, and a third semiconductor layer of the second electroconductive type formed on the outer layer portion of said first semiconductor layer so that a joint surface is formed with said second semiconductor layer; it is formed such that when said solid-state image pickup device is turned ON, the depletion layer extending from said joint plane does not reach the side surface of said element separating insulating film.

The solid-state image pickup device of an aspect of the present invention has plural pixels integrated in array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is set via said transfer transistor to said photodiode, and accumulates the photoelectric charge overflowing from said photodiode in the accumulating operation via said transfer transistor, and an accumulating transistor that connects or divides the potentials of said floating diffusion and said accumulating capacitive element, with one source/drain region becoming said floating diffusion and with the other source/drain region connected to said accumulating capacitive element.

Here, in at least one of said source/drain regions that form said accumulating transistor, there are the following layers: a first semiconductor layer of the first electroconductive type that is formed in the active region of said semiconductor substrate and is divided by the element separating insulating film, a second semiconductor layer of the first electroconductive type formed in said first semiconductor layer such that at least the side surface of said element separating insulating film is covered, and a third semiconductor layer of the second electroconductive type formed on the outer layer portion of said first semiconductor layer so that a joint surface is formed with said second semiconductor layer; it is formed such that when said solid-state image pickup device is turned ON, the depletion layer extending from said joint plane does not reach the side surface of said element separating insulating film.

For said solid-state image pickup device of an aspect of the present invention, each said pixel has the gate electrode for amplifying transistor connected to said floating diffusion, and the amplifying transistor is formed with a side wall insulating film formed on the side portion of said gate electrode for amplifying transistor; in at least one of said source/drain regions that form said accumulating transistor, there are a first insulating layer formed on the upper layer of said second semiconductor layer and said third semiconductor layer, a second insulating layer formed on the upper layer of said first insulating layer, a contact hole that goes through said first insulating layer and said second insulating layer to reach said third semiconductor layer, and an electroconductive layer formed connected to said semiconductor substrate in said contact hole; the end portion of the depletion layer, which extends from said joint plane when said solid-state image pickup device is turned ON, at the interface between said second semiconductor layer as well as said third semiconductor layer and said first insulating layer is covered with said first insulating film; and said first insulating layer is formed of the same insulating material as that of said side wall insulating film.

In addition, for an aspect of said solid-state image pickup device of the present invention, it also has a reset transistor that is connected to said accumulating capacitive element or said floating diffusion for discharging the photoelectric charge in said accumulating capacitive element and/or said floating diffusion.

For said solid-state image pickup device of an aspect of the present invention, it also has a selecting transistor that is connected in series to said amplifying transistor and has a gate electrode for the selecting transistor for selecting said pixel, and said side wall insulating film is also formed on the side portion of the gate electrode for said selecting transistor.

For said solid-state image pickup device of an aspect of the present invention, said first insulating film has an opening portion with diameter larger than said contact hole formed on it, and said second insulating film is composed of plural insulating films.

In order to address the aforementioned problem, an aspect of the present invention also provides a method of manufacturing a solid-state image pickup device characterized by the following facts: the solid-state image pickup device has plural pixels integrated in array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is set via said transfer transistor to said photodiode, and accumulates the photoelectric charge overflowing from said photodiode in the accumulating operation via said transfer transistor, and an accumulating transistor that connects or divides the potentials of said floating diffusion and said accumulating capacitive element, with one source/drain region becoming said floating diffusion and with the other source/drain region connected to said accumulating capacitive element; in this method of manufacturing a solid-state image pickup device, there are the following steps of operation: a step of operation in which an element separating insulating film is formed for dividing the active region in the first semiconductor layer of the first electroconductive type of said semiconductor substrate, a step of operation in which a second semiconductor layer of the first electroconductive type is formed in contact with said element separating insulating film in said first semiconductor layer such that the shape covers at least the side surface of said element separating insulating film, and a step of operation in which a third semiconductor layer of the second electroconductive type is formed on the outer layer portion of said first semiconductor layer such that a joint plane is formed between it and said second semiconductor layer; at least one of said source/drain regions that form said accumulating transistor is formed such that the depletion layer that extends from said joint plane when said solid-state image pickup device is turned ON does not reach the side surface of said element separating insulating film.

According to the aforementioned method of manufacturing a solid-state image pickup device of the present invention, the solid-state image pickup device has plural pixels integrated in array configuration on a semiconductor substrate; each pixel has the following parts: a photodiode that receives light and generates and accumulates photoelectric charge, a transfer transistor that transfers said photoelectric charge from said photodiode, a floating diffusion that transfers said photoelectric charge via said transfer transistor, an accumulating capacitive element that is set via said transfer transistor to said photodiode, and accumulates the photoelectric charge overflowing from said photodiode in the accumulating operation via said transfer transistor, and an accumulating transistor that connects or divides the potentials of said floating diffusion and said accumulating capacitive element, with one source/drain region becoming said floating diffusion and with the other source/drain region connected to said accumulating capacitive element.

In this method of manufacturing a solid-state image pickup device, there are the following steps of operation: first, an element separating insulating film is formed for dividing the active region in the first semiconductor layer of the first electroconductive type of said semiconductor substrate; then, a second semiconductor layer of the first electroconductive type is formed in contact with said element separating insulating film in said first semiconductor layer such that the shape covers at least the side surface of said element separating insulating film; after that, a third semiconductor layer of the second electroconductive type is formed on the outer layer portion of said first semiconductor layer such that a joint plane is formed between it and said second semiconductor layer. As a result of the aforementioned operation, at least one of said source/drain regions that form said accumulating transistor is formed such that the depletion layer that extends from said joint plane when said solid-state image pickup device is turned ON does not reach the side surface of said element separating insulating film.

For said method of manufacturing a solid-state image pickup device, of an aspect of the present invention for the solid-state image pickup device, each said pixel has the gate electrode for amplifying transistor connected to said floating diffusion, and the amplifying transistor is formed with a side wall insulating film formed on the side portion of said gate electrode for amplifying transistor; in this manufacturing method, there are also the following steps of operation after the step of operation of formation of the third semiconductor layer: a step of operation in which a first insulating layer is formed on the upper layer of said second semiconductor layer and said third semiconductor layer, a step of operation in which a second insulating layer is formed on the upper layer of said first insulating layer, a step of operation in which a contact hole that goes through said first insulating layer and said second insulating layer to reach said third semiconductor layer is formed, and a step of operation in which an electroconductive layer is formed connected to said semiconductor substrate in said contact hole; in said step of operation in which said first insulating film is formed, an insulating film as said side wall insulating film is formed simultaneously in the region for forming said pixel selecting transistor; and the end portion of the depletion layer, which extends from said joint plane when said solid-state image pickup device is turned ON, at the interface between said second semiconductor layer as well as said third semiconductor layer and said first insulating layer is covered with said first insulating film in the structure.

For said method of manufacturing a solid-state image pickup device of an aspect of the present invention, in the method of manufacturing a solid-state image pickup device that also has a selecting transistor that is connected in series to said amplifying transistor and has a gate electrode for the selecting transistor for selecting said pixel, in the step of operation in which said first insulating film is formed, in the region of formation of said selecting transistor, an insulating film as said side wall insulating film is also formed at the same time.

For said method of manufacturing a solid-state image pickup device of an aspect of the present invention, after said step of operation in which said first insulating film is formed and before said step of operation of formation of said second insulating film, there is also a step of operation in which said first insulating film has an opening portion with diameter larger than said contact hole formed on it, and, in said step of operation of formation of said second insulating film, plural insulating films are formed as said second insulating film.

BRIEF DESCRIPTION OF THE DRAWINGS

FIG. 6 is a schematic diagram illustrating the state of the depletion layer formed in said floating diffusion FD when the solid-state image pickup device is turned ON.

REFERENCE NUMERALS AND SYMBOLS AS SHOWN IN THE DRAWINGS

Figure 1:
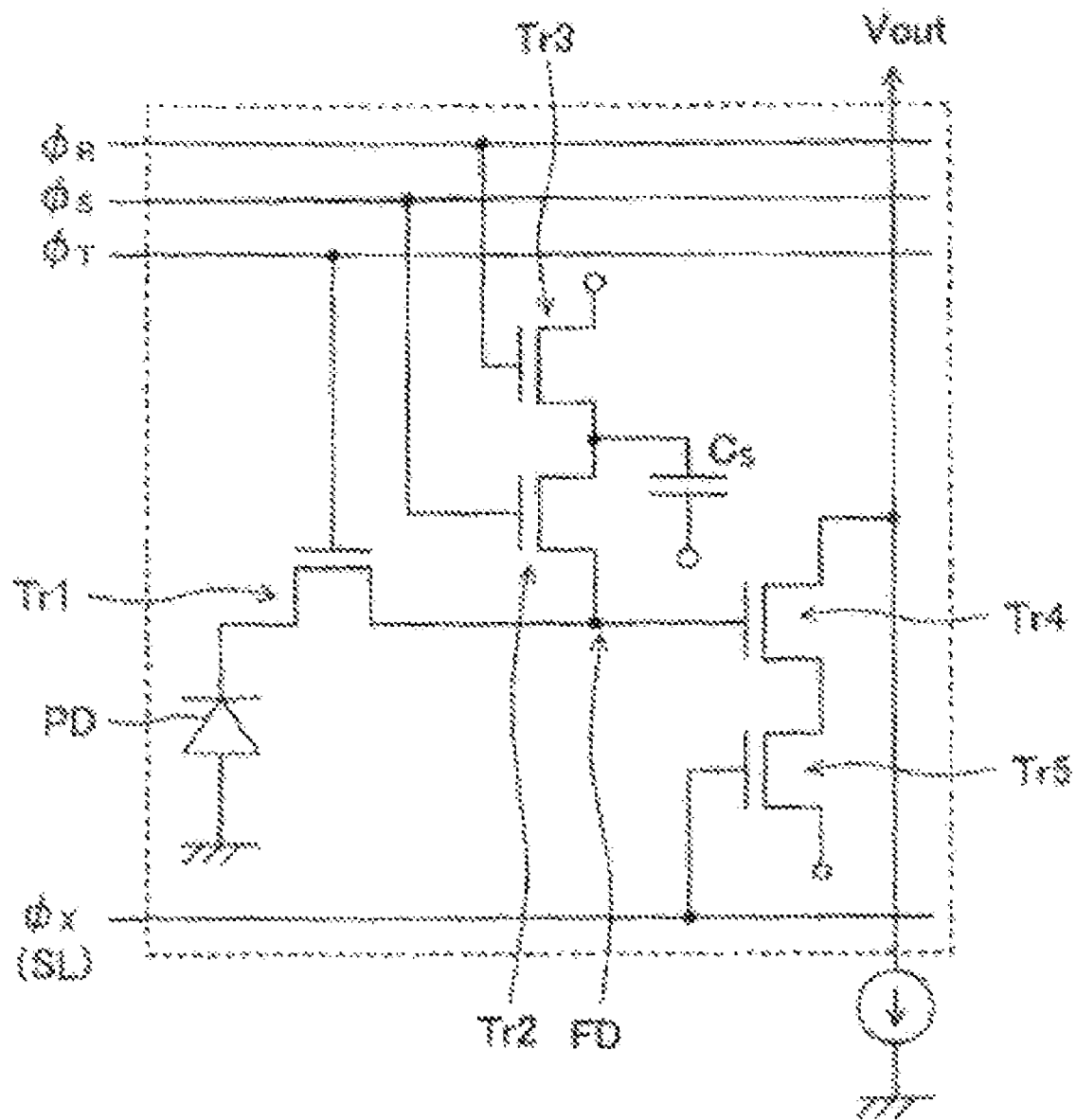
FIG. 1 is an equivalent circuit diagram illustrating one pixel of the CMOS image sensor pertaining to an embodiment of the present invention.

In the figures, 10 represents an n-type semiconductor substrate; 11, 11a, 11b p-type well, 12 p$^+$-type separating region; 13 n-type semiconductor region; 14, 17 p$^+$-type semiconductor region; 15, 16 n$^+$-type semiconductor region; 15a p-type layer; 20, 21, 22 element separating insulating film; 23, 24 gate insulating film; 25 capacitive insulating film; 30, 31 gate electrode; 32 upper electrode; 33, 34 wiring; 40, 41 element separating insulating film; 42 p$^+$-type layer; 43 gate insulating film; 44 gate electrode; 45 LDD layer; 46 first insulating film; 46a side wall insulating film; 47 source/drain layer; 48, 49 silicide layer; 50 second insulating film; 51 n$^+$-type layer; 52 silicide layer; 53 silicide blocking layer; ADC1-3 A/D converter; AP amplifier; $C_{FD}$, $C_{PD}$, C capacitance; $C_S$ accumulating capacitive element; CH chip; CP comparator; CTa, CTb circuit; DC1, DC2 differential amplifier; FD floating diffusion; FM frame memory; GND ground; LT light; $N_1$ signal of reset level of $C_{FD}$ (noise); $N_2$ signal of reset level of $C_{FD}+C_S$ (noise); Noise noise; Out output (line); PD photodiode; Pixel pixel; QA over-saturation charge; QA1, QA2 a portion of over-saturation charge; QB before-saturation charge; $S_1$ before-saturation charge signal; $S_1'$ modulated before-saturation charge signal; $S_2$ over-saturation charge signal; $S_2'$ modulated over-saturation charge signal; SE selector; SL selection line; SRH column shift register; SRV row shift register; $T_1$-$T_4$ time; $Tr_1$ transfer transistor; $Tr_2$ accumulating transistor; $Tr_3$ reset transistor; $Tr_4$ amplifying transistor; $Tr_5$ selecting transistor; V depletion layer; $V_{DD}$ power source voltage; and φT, φS, φR, φX, S1+N1, φN1, φS1'+S2'+N2, φN2, φV1, φV2 driving line.

DESCRIPTION OF THE EMBODIMENTS

In the solid-state image pickup device with a wide dynamic range of an aspect of the present invention, at least one of the source/drain regions that form the accumulating transistor is formed such that when the solid-state image pickup device is turned ON, the depletion layer extending from the joint plane does not reach the side surface of the element separating insulating film. As a result, it is possible to suppress the dark current component with respect to the photo-electrons overflowing from the photodiode.

According to the method of manufacturing the solid-state image pickup device with a wide dynamic range of an aspect of the present invention, at least one of the source/drain regions that form the accumulating transistor is formed such that when the solid-state image pickup device is turned ON, the depletion layer extending from the joint plane does not reach the side surface of the element separating insulating film. As a result, it is possible to suppress the dark current component with respect to the photo-electrons overflowing from the photodiode.

In the following, embodiments of the solid-state image pickup device and its manufacturing method will be explained with reference to figures.

Embodiment 1

The solid-state image pickup device in this embodiment is a CMOS image sensor, and FIG. 1 is an equivalent circuit diagram of a pixel.

Each pixel has the following parts: photodiode PD that receives light and generates and accumulates photoelectric charge, transfer transistor Tr1 that transfers said photoelectric charge from said photodiode PD, floating diffusion FD that transfers said photoelectric charge via said transfer transistor TR1, accumulating capacitive element $C_S$ that is set via said floating diffusion FD to said photodiode, and at least accumulates the photoelectric charge overflowing from said photodiode in the accumulating operation via said transfer transistor, accumulating transistor Tr2 that connects or divides the potentials of said floating diffusion FD and said accumulating capacitive element $C_S$, reset transistor Tr3 for discharging the photoelectric charge in floating diffusion FD, amplifying transistor Tr4 that amplifies the photoelectric charge in said floating diffusion FD and converts it to a voltage signal, and selecting transistor Tr5 that is connected to the amplifying transistor and serves for pixel selection. That is, it is a so-called 5-transistor type CMOS image sensor. For example, all five transistors can be n-channel MOS transistors.

The CMOS image sensor in the present embodiment has plural pixels, each having this constitution, integrated with each other. For each pixel, driving lines φT, φS, φR are connected to the gate electrodes of said transfer transistor Tr1, accumulating transistor Tr2 and reset transistor Tr3, respectively. Also, pixel selecting line SL (φX) driven by the row shift register is connected to the gate electrode of selecting transistor Tr5 that connects output line out to the output side source/drain of amplifying transistor Tr4, so that a voltage signal controlled by the row shift register is output. With regard to selecting transistor Tr5 and driving line φX, they can be omitted because the voltage of floating diffusion FD can be fixed at an appropriate value so that pixel selection/nonselection operation can be performed.

Figure 2:
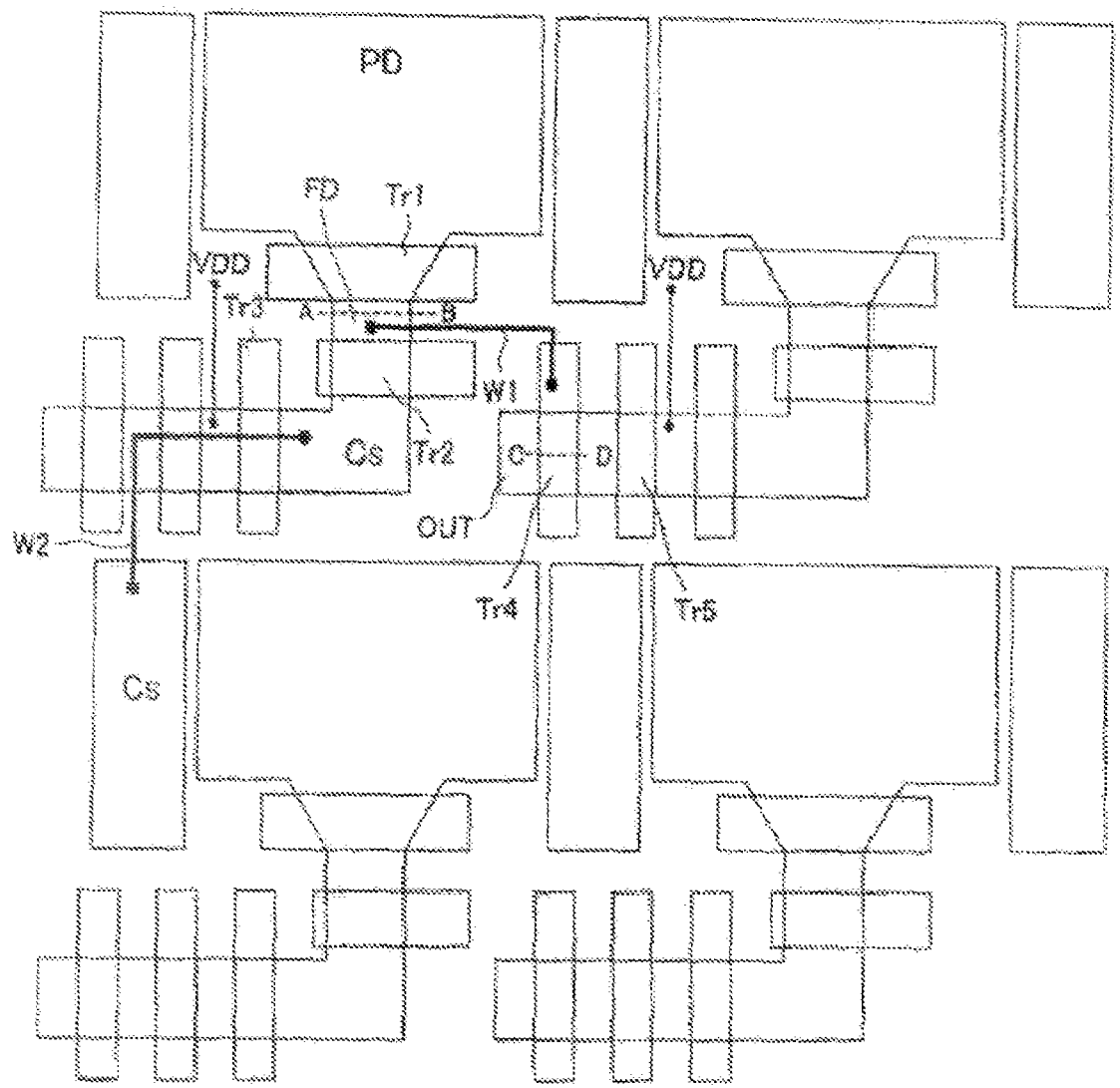
FIG. 2 is a diagram illustrating an example of the layout of about 1 pixel when a planar type accumulating capacitive element is adopted for the CMOS image sensor in the embodiment of the present invention.

FIG. 2 is a diagram illustrating an example of the layout of a pixel adopting the planar type accumulating capacitive element in the CMOS solid-state image pickup device of this embodiment.

Said photodiode PD, accumulating capacitive element $C_S$, and five transistors Tr1-Tr5 are arranged as shown in the figure. Also, floating diffusion FD between said transfer transistor Tr1 and accumulating transistor Tr2 and the gate of amplifying transistor Tr4 are connected by wiring W1, and the diffusion layer between accumulating transistor Tr2 and reset transistor Tr3 and the upper electrode of accumulating capacitive element $C_S$ are connected by wiring W2. In this way, a circuit corresponding to the equivalent circuit diagram of this embodiment shown in FIG. 1 can be realized.

In this layout, the width of the channel of transfer transistor Tr1 is formed such that it is wider on the side of photodiode PD and narrower on the side of floating diffusion FD. As a result, the charge overflowing from the photodiode can overflow with high efficiency to the side of the floating diffusion. On the other hand, as it is narrower on the side of floating diffusion FD, the capacitance of floating diffusion FD can be reduced, so that the variation range of the potential with respect to the charge accumulated in floating diffusion FD can be larger.

Figure 3:
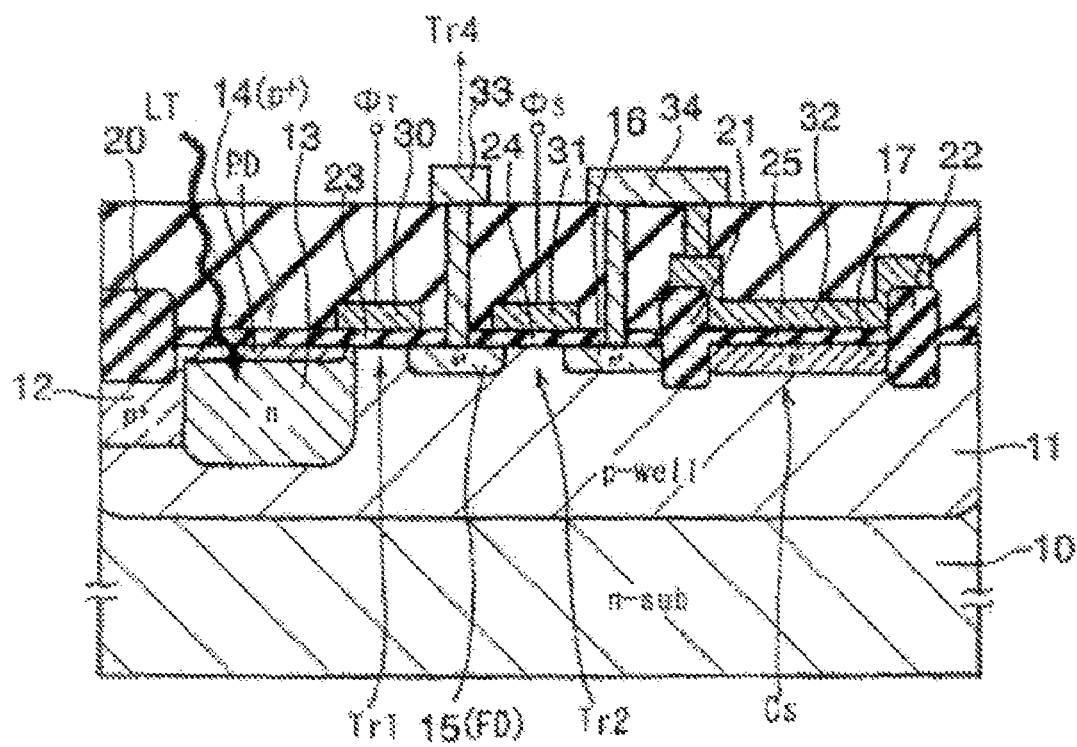
FIG. 3 is a schematic cross section illustrating a portion of a pixel of the CMOS image sensor pertaining to the embodiment of the present invention.

FIG. 3 is a schematic cross section illustrating a portion of each pixel of the CMOS image sensor in the present embodiment (photodiode PD, transfer transistor Tr1, floating diffusion FD, accumulating transistor Tr2 and accumulating capacitive element $C_S$).

For example, p-type well (p-well) 11 is formed on n-type silicon semiconductor substrate (n-sub) 10, element separating insulating films 20, 21, 22 are formed using the LOCOS method to divide the regions of various elements and accumulating capacitive elements $C_S$, and $p^+$-type separating region 12 is formed in the part of p-type well 11 lying below element separating insulating film 20 that separates pixels.

An n-type semiconductor region 13 is formed in p-type well 11. A $p^+$-type semiconductor region 14 is formed in its surface layer. Photodiode PD of the charge transfer embedding type is formed by means of this pn junction. When light LT is incident on the depletion layer created when an appropriate bias is applied to the pn junction, a photoelectric charge is generated due to the photoelectric effect.

In the end portion of n-type semiconductor region 13, there is a region formed by a protrusion of $p^+$-type semiconductor region 14; and on the outer layer of p-type well 11 and at a site separated by a prescribed distance from said region, $n^+$-type semiconductor region 15 is formed as floating diffusion FD; and at a site separated by a prescribed distance from this region, $n^+$-type semiconductor region 16 is formed in the outer layer of p-type well 11. Here, in the region pertaining to n-type semiconductor region 13 and $n^+$-type semiconductor region 15, gate electrode 30 is formed from silicon or the like via gate insulating film 23, made of silicon oxide or the like, on the upper surface of p-type well 11. With n-type semiconductor region 13 and $n^+$-type semiconductor region 15 serving as source and drain, transfer transistor Tr1 is formed that has a channel-forming region in the outer layer of p-type well 11.

In the region pertaining to $n^+$-type semiconductor region 15 and $n^+$-type semiconductor region 16, gate electrode 31 made of polysilicon or the like is formed via gate insulating film 24, made of silicon oxide or the like, on the upper surface of p-type well 11. With $n^+$-type semiconductor region 15 and $n^+$-type semiconductor region 16 serving as source and drain, accumulating transistor Tr2 is formed that has a channel-forming region in the outer layer of p-type well 11.

Also, in the region divided by element separating insulating films 21, 22, $p^+$-type semiconductor region 17 is formed as the lower electrode in the outer layer of p-type well 11. On its upper layer, upper electrode 32 made of polysilicon or the like is formed via capacitive insulating film 25 made of silicon oxide or the like, and these parts form accumulating capacitive element $C_S$.

An insulating film made of silicon oxide is formed to cover transfer transistor Tr1, accumulating transistor Tr2, and accumulating capacitive element $C_S$. Openings are formed to reach $n^+$-type semiconductor region 15, $n^+$-type semiconductor region 16 and upper electrode 32, and wiring 33 connected to n+-type semiconductor region 15 and wiring 34 connected to n+-type semiconductor region 16 and upper electrode 32 are respectively formed. Also, driving line φT is formed connected to gate electrode 30 of transfer transistor Tr, and driving line φS is formed connected to gate electrode 31 of accumulating transistor Tr2.

There are other elements, that is, reset transistor Tr3, amplifying transistor Tr4, selecting transistor Tr5, driving lines φT, φS, φR, φX, and output line (out). They are formed in regions not shown in the figure on semiconductor substrate 10 shown in FIG. 3 so as to form the equivalent circuit shown in FIG. 1.

Figure 4:
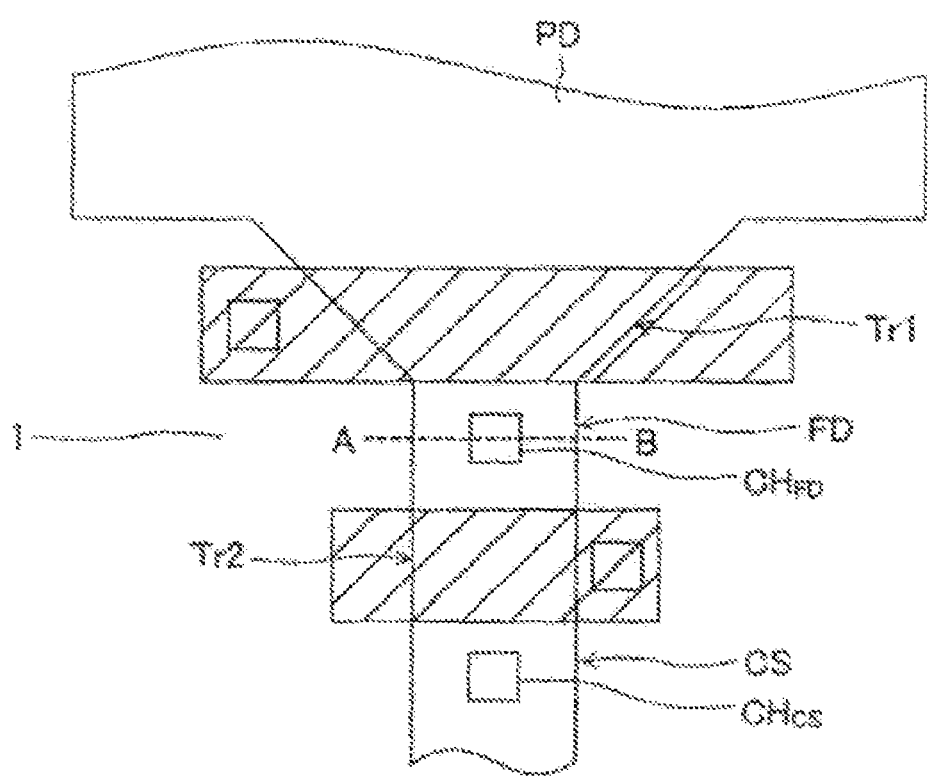
FIG. 4 is a diagram illustrating an example of a layout corresponding to a portion of the pixel of the CMOS solid-state image pickup device in the embodiment of the present invention.

FIG. 4 is a diagram illustrating an example of the layout of a portion of the pixel of the CMOS solid-state image pickup device in this embodiment.

In the active region surrounded by LOCOS or another element separating insulating film I on the semiconductor substrate, transfer transistor Tr1 is formed connected to photodiode PD, and accumulating transistor Tr2 is formed connected in series to transfer transistor Tr1. The diffusion layer between transfer transistor Tr1 and accumulating transistor Tr2 is floating diffusion FD. Also, the diffusion layer on the other side of the accumulating transistor is connected to accumulating capacitive element $C_S$, and this will be referred to as the $C_S$ diffusion layer.

Figure 5:
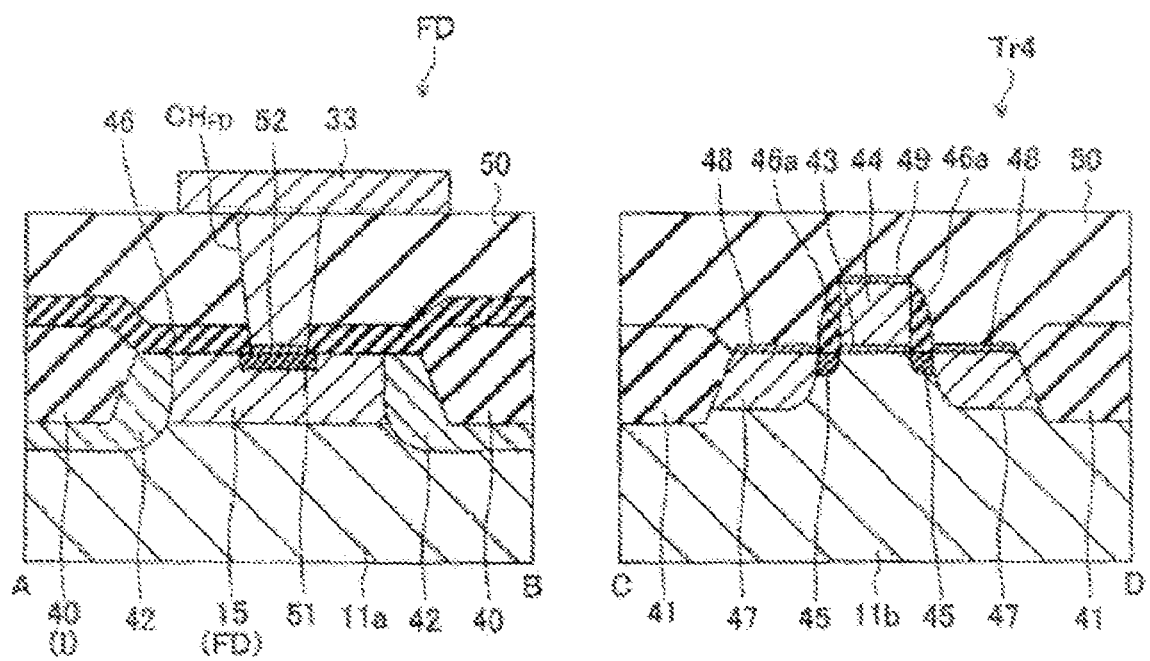
FIG. 5 includes a cross section taken across A-B in FIGS. 4 and 2 illustrating the floating diffusion, and the cross section taken across C-D in FIG. 2.

FIG. 5 includes a cross section taken across A-B in FIGS. 4 and 2 illustrating floating diffusion FD, and a cross section taken across C-D in FIG. 2 illustrating amplifying transistor Tr4. First of all, floating diffusion FD will be explained.

For example, to divide the various pixels and regions of accumulating capacitive elements $C_S$, element separating insulating film 40 is formed by means of the LOCOS method in p-type well (first semiconductor layer) 11a formed in the active region of the n-type silicon semiconductor substrate. A p+-type layer (second semiconductor layer) 42 is formed in p-type well 11, such that at least the side surface of element separating insulating film 40 is covered. Also, n+-type semiconductor region (third semiconductor layer) 15 is formed in the outer layer portion of p-type well 11 such that a joint plane is formed with p+-type layer 42. Said n+-type semiconductor region 15 is the source/drain of transfer transistor Tr1 and accumulating transistor Tr2, and it becomes the floating diffusion FD of the pixel.

In addition, first insulating film 46 made of silicon oxide is formed on the upper layer of p+-type layer 42 and n+-type semiconductor region 15, and second insulating film 50 is formed on the upper layer of said first insulating film. Contact hole $CH_{FD}$ is formed through first insulating film 46 and second insulating film 50 to reach n+-type semiconductor region 15 (FD). An n+-type contact layer 51 is formed on the outer layer of n+-type semiconductor region 15 (FD) at the opening of contact hole $CH_{FD}$. Silicide layer 52 made of titanium silicide or the like is formed on its surface, and wiring 33 made of an electroconductive layer is formed connected to it.

Figure 6:
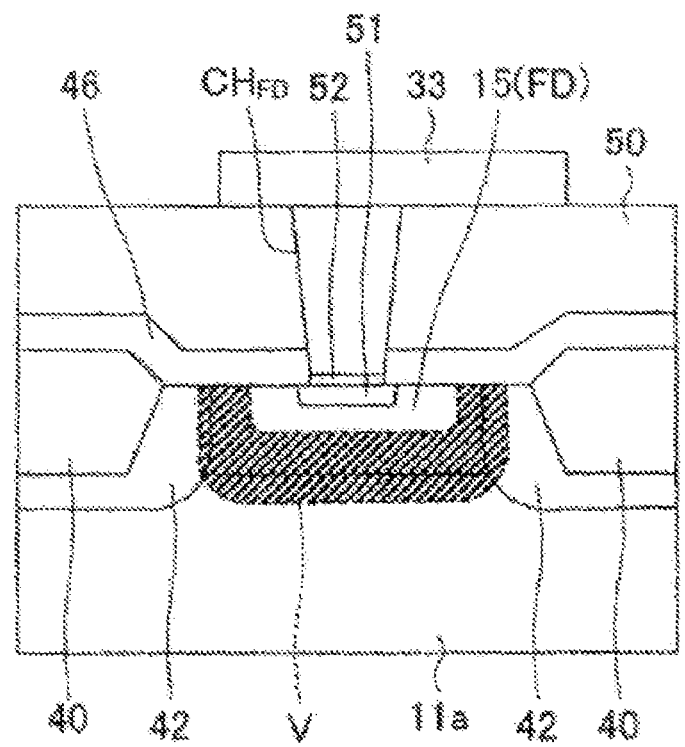

FIG. 6 is a schematic diagram illustrating the state of the depletion layer formed in floating diffusion FD when the solid-state image pickup device is turned ON.

Said depletion layer V is formed extending from the joint plane between p-type well 11a, as well as p+-type layer 42, and n+-type semiconductor region 15 as a P-N junction towards both the p side and n side. In the solid-state image pickup device of the present embodiment, p+-type layer 42 is formed to cover the side surface of element separating insulating film 40, and this design prevents the formed depletion layer V from reaching the side surface of element separating insulating film 40.

In the following, amplifying transistor Tr4 will be explained with reference to FIG. 5.

For example, element separating insulating film 41 is formed, using the LOCOS method or the like, in p-type well 11b formed in the active region of the n-type silicon semiconductor substrate, and gate electrode 44 is formed via gate insulating film 43 on the channel-forming region of p-type well 11b. Side wall insulating film 46a is formed on the two side portions of gate electrode 44. Also, LDD (lightly doped drain) layer 45 and source/drain layer 47 are formed in p-type well 11b on the two side portions of gate electrode 44.

Silicide layers 48, 49 made of titanium silicide or the like are formed on the surface of source/drain layer 47 and the surface of gate electrode 44 in a self-alignment configuration known as SALICIDE. As explained above, a transistor with an LDD structure having a side wall insulating film on both sides of the gate electrode is formed as amplifying transistor Tr4.

Insulating film 50, such as silicon oxide or the like, is formed over the entire surface to cover the amplifying transistor, and a contact is formed on gate electrode 44, in a region not shown in the figure, to connect wiring 33 to floating diffusion FD. Also, a contact is formed on the source/drain of the accumulating transistor. In the constitution of said floating diffusion FD, the end portion of depletion layer V at the interface between p+-type layer 42, as well as n+-type semiconductor region 15, and first insulating film 46 is covered by said first insulating film 46. Also, said first insulating film 46 is made of the same insulating material as that for side wall insulating film 46a that forms amplifying transistor Tr4.

In the following, the process of manufacturing the solid-state image pickup device will be explained with respect to floating diffusion FD and amplifying transistor Tr4 portions.

Figure 7:
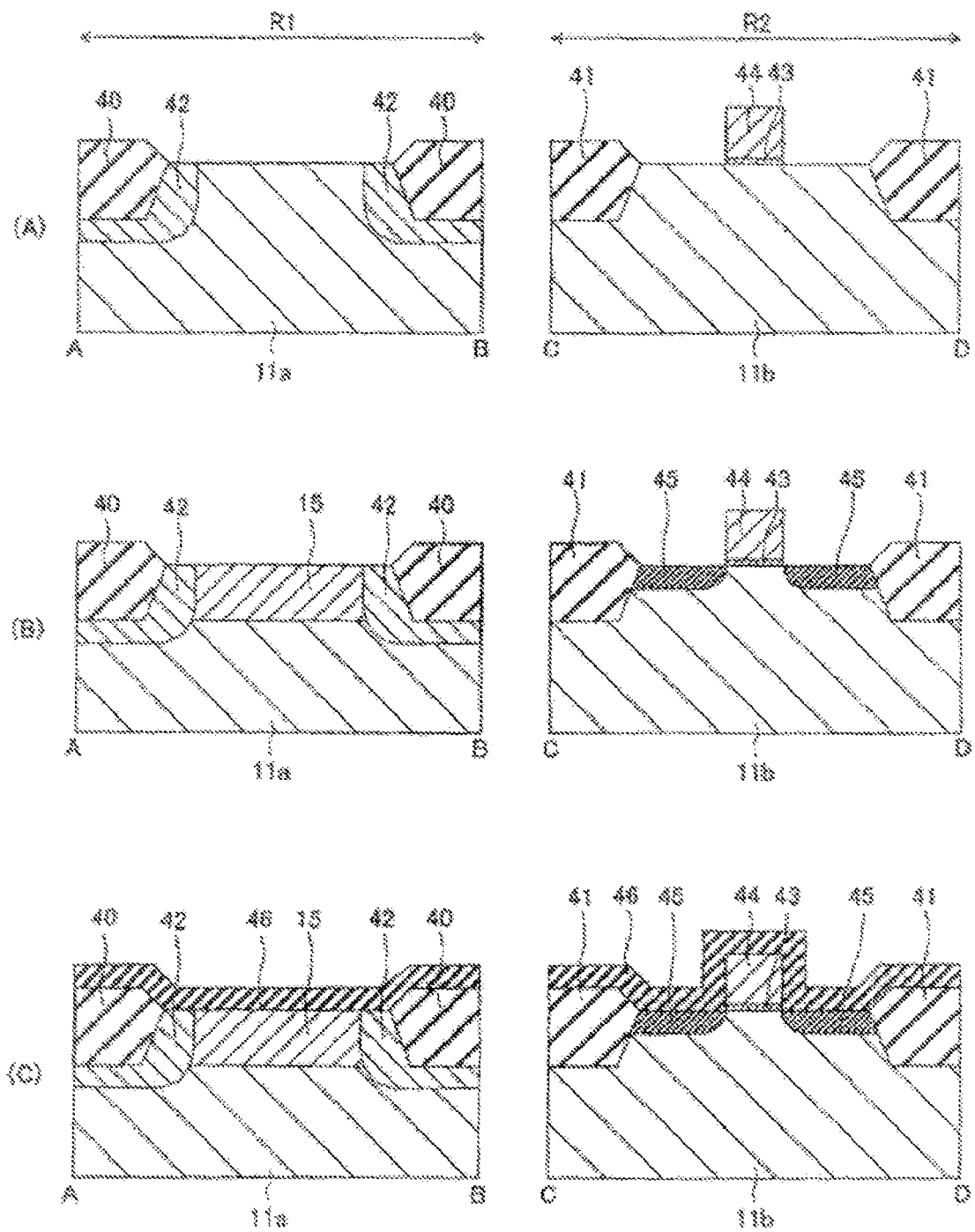
FIGS. 7(A)-(C) are cross sections illustrating the process of manufacturing the solid-state image pickup device shown in FIG. 5.
Figure 8:
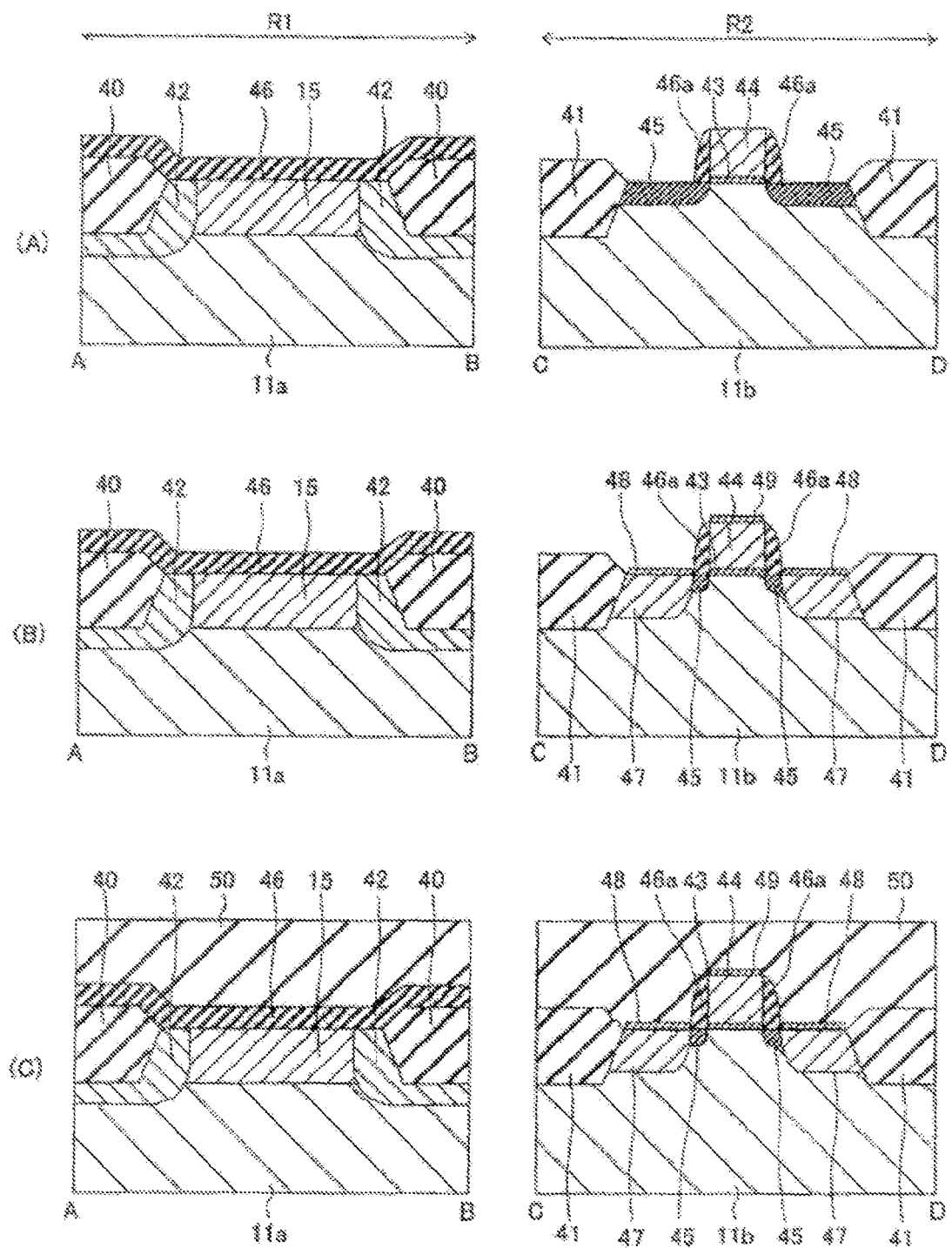
FIGS. 8(A)-(C) are cross sections illustrating the process of manufacturing the solid-state image pickup device shown in FIG. 5.
Figure 9:
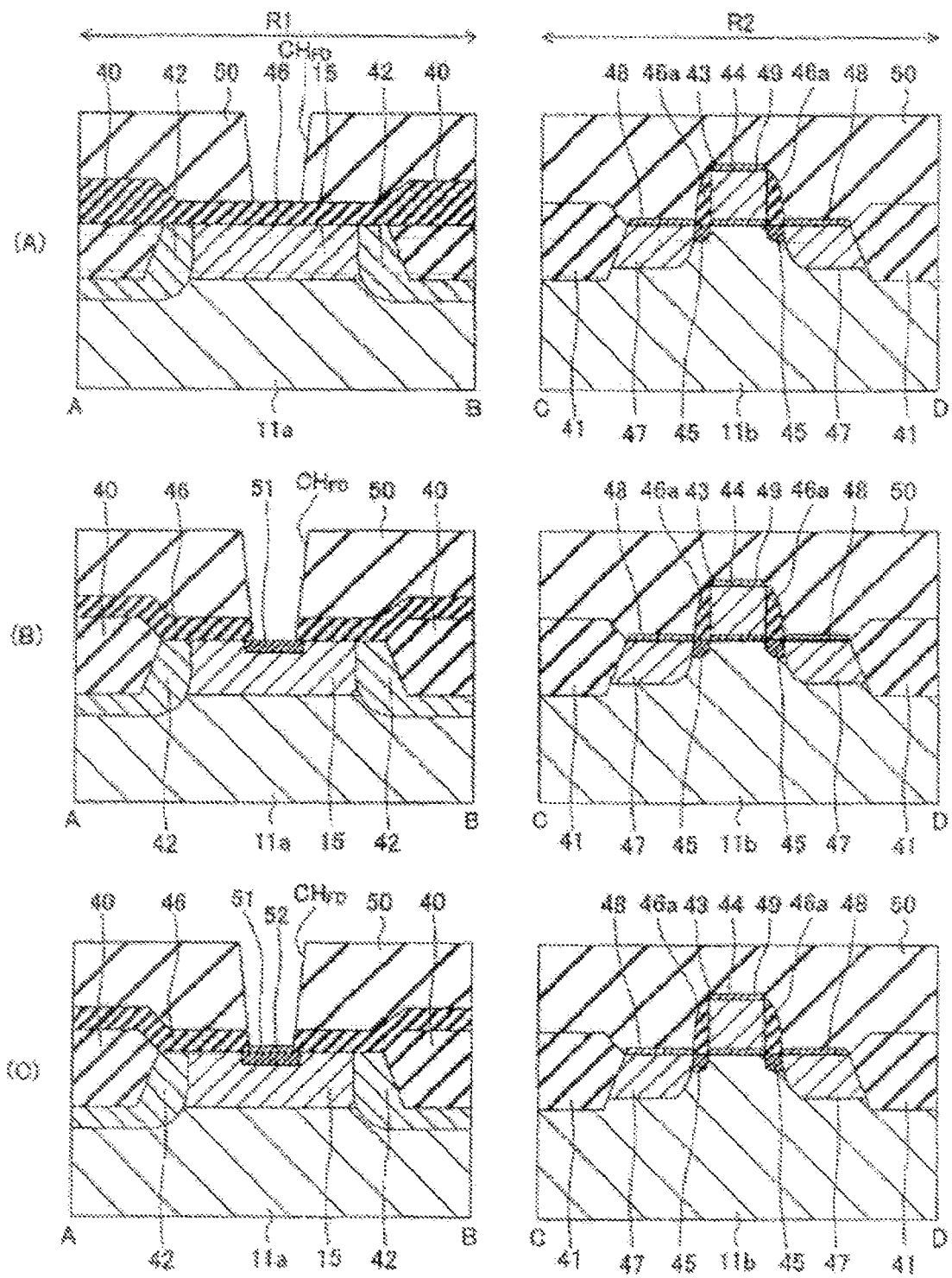
FIGS. 9(A)-(C) are cross sections illustrating the process of manufacturing the solid-state image pickup device shown in FIG. 5.

FIGS. 7-9 are cross sections illustrating the process of manufacturing the solid-state image pickup device. In FIGS. 7-9, region R1 on the left-hand side of the figure is the region of floating diffusion formation of, while region R2 on the right-hand side is the region of amplifying transistor formation.

First of all, in floating diffusion formation region R1 as shown in FIG. 7(A), p-type well 11a (first semiconductor layer) is formed on an n-type semiconductor substrate by introduction of an impurity. Element separating insulating film 40 is then formed for dividing the active regions of LOCOS or $ST_1$, etc. Then p+-type layer 42 (second semiconductor layer) is formed in p-type well 11a in contact with element separating insulating film 40, shaped such that it covers at least the side surface of the element separating insulating film.

Similarly, amplifying transistor in formation region R2 as well, element separating insulating film 41 is formed in the p-type well 11b (first semiconductor layer) formed in the active region of the n-type silicon semiconductor substrate. In addition, the pattern of gate insulating film 43 and gate electrode 44 is formed on p-type well 11b.

Then, in floating diffusion formation region R1 as shown in FIG. 7(B), for example, a photoresist film pattern is formed as a mask, and an n-type impurity is ion implanted to form n+-type semiconductor region 15 (third semiconductor layer) on the outer layer of p-type well 11a so that p+-type layer 42 and a joined surface are formed.

On the other hand, in amplifying transistor formation region R2, with gate electrode 44 serving as a mask, an n-type impurity is ion implanted to form LDD layer 45 in p-type well 11b on the two side portions of gate electrode 44.

Then, in floating diffusion formation region $R_1$ and amplifying transistor formation region $R_2$ as shown in FIG. 7(C), silicon oxide is accumulated by methods such as CVD (chemical vapor desposition), and first insulating film 46 is formed.

First insulating film 46 is the layer which becomes the side wall insulating film in amplifying transistor formation region $R_2$. Then, in amplifying transistor formation region R2 as shown in FIG. 8(A), first insulating film 46 is etched back over the entire surface such that side wall insulating film 46a remains on the two side portions of gate electrode 44.

On the other hand, in floating diffusion formation region R1, first insulating film 46 is not etched because it is protected by the resist film or the like. Then, in amplifying transistor formation region R2 as shown in FIG. 8(B), side wall insulating film 46a is used as a mask, and ion implantation is performed with an n-type impurity to form source/drain layer 47.

Then a high-melting-point metal such as titanium or the like, is deposited over the entire surface, and heat treatment is performed to form a self-aligned silicide layer in the region where silicon is exposed. With this SALICIDE process, silicide layers 48, 49 are formed. On the other hand, in the SALICIDE process, floating diffusion formation region R1 is protected by the first insulating film, and silicon is not exposed, so that the silicide layer is not formed.

Then, in floating diffusion formation region R1 and amplifying transistor formation region R2 of, as shown in FIG. 8(C), for example, silicon oxide is deposited by means of CVD or a like method to form second insulating film 50. Then, in floating diffusion formation region R1 as shown in FIG. 9(A), contact hole $CH_{FD}$ is formed through second insulating film 50 and first insulating film 46 to reach $n^+$-type semiconductor region 15 (third semiconductor layer) serving as floating diffusion FD.

Then, in floating diffusion formation region R1 as shown in FIG. 9(B), an n-type impurity is ion implanted in contact hole $CH_{FD}$ to form $n^+$-type contact layer 51. Then, in floating diffusion formation region R1 as shown in FIG. 9(C), silicide layer 52 is formed on $n^+$-type contact layer 51 in said contact hole $CH_{FD}$. In addition, an electroconductive layer is embedded in contact hole $CH_{FD}$, and wiring 33 is formed on second insulating film 50 together with the plug. In this way, a CMOS sensor with the constitution shown in FIG. 5 can be manufactured.

In this manufacturing method of the solid-state image pickup device with a wide dynamic range of the present embodiment, at least one of the source/drain regions that form the accumulating transistor is formed such that the depletion layer extending from the joint plane when the solid-state image pickup device is turned ON does not reach the side surface of the element separating insulating film. As a result, it is possible to manufacture a solid-state image pickup device that can suppress the dark current component with respect to the photo-electrons overflowing from the photodiode.

In addition, in the etch-back step for forming the side wall insulating film formed in the amplifying transistor, etc., at the position of the end portion of depletion layer V at the interface between $p^+$-type layer 42, as well as $n^+$-type semiconductor region 15 in floating diffusion FD, and first insulating film 46, is covered and protected by first insulating film 46, so that it is possible to manufacture a solid-state image pickup device in which damage to the surfaces of $p^+$-type layer 42 and $n^+$-type semiconductor region 15 is avoided and the dark current component can be suppressed.

The following scheme can be adopted in the manufacturing process described above: first insulating film 46 is made of silicon oxide, the second insulating film (silicon oxide) is formed on its upper layer, and etching is performed once to form the contact hole opening passing through them.

The first insulating film in the floating diffusion can be made of the same type of insulating material as that of the side wall insulating film formed on the selecting transistor, transistors of the peripheral circuit, and other transistors other than the amplifying transistor. It can be formed at the same time as said side wall insulating films. In the floating diffusion formation region, the position that is the end portion of depletion layer V can be used as the layer protected from etch-back.

This protection from etch-back of the position of the end portion of depletion layer V having said constitution is not limited to said floating diffusion FD. The same also applies for the $C_S$ diffusion layer. At least one of floating diffusion FD and $C_S$ diffusion layer, or preferably both of them, can have the aforementioned constitution in order to display the dark current suppression effect.

Figure 10:
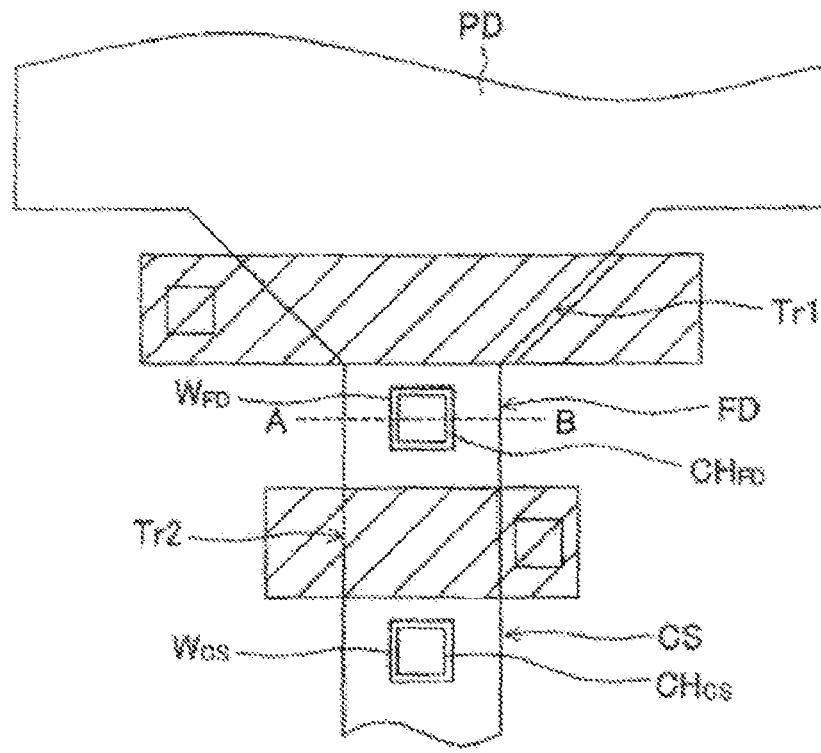
FIG. 10 is a diagram illustrating a modified example of a layout corresponding to a portion of a pixel in the CMOS solid-state image pickup device in the embodiment of the present invention.

FIG. 10 is a diagram illustrating a modified example of the layout corresponding to a portion of the pixel of the CMOS solid-state image pickup device in this embodiment.

Figure 11:
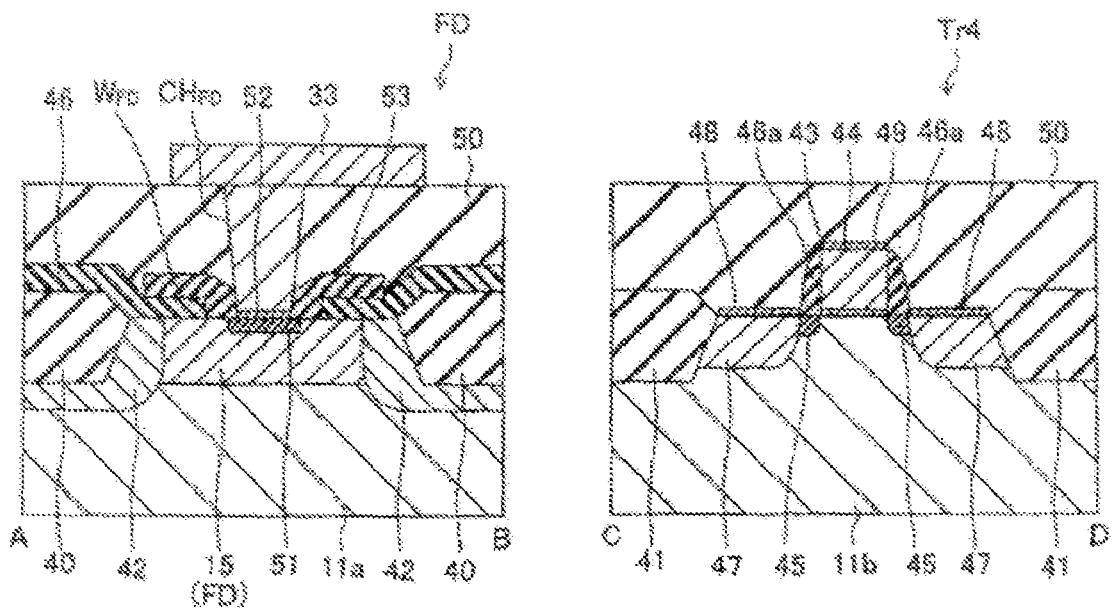
FIG. 11 includes a cross section of the floating diffusion taken across A-B in FIG. 10, and a cross section of the accumulating transistor.

FIG. 11 includes a cross section taken across A-B in FIG. 10 illustrating the floating diffusion FD, and a cross section illustrating amplifying transistor Tr4.

In this modified example, since side wall insulating film 46a, that is, first insulating film 46, can be made of silicon nitride, the material is different from that of second insulating film 50, that is, silicon oxide.

In this case, it is impossible in the manufacturing process to form the contact hole opening through first insulating film 46 and second insulating film 50 by etching them once. As a result, after the formation of first insulating film 46, opening window $W_{FD}$ with a diameter larger than contact hole $CH_{FD}$ is formed in first insulating film 46, and second insulating film 50 is laminated on its upper layer. With regard to the position of said opening window $W_{FD}$, the layout is such that it becomes the end portion of depletion layer V at the interface between $p^+$-type layer 42, as well as $n^+$-type semiconductor region 15 in floating diffusion FD, and first insulating film 46.

Also, as aforementioned, because in the manufacturing process the silicide layer of the amplifying transistor or the like is formed while opening window $W_{FD}$ is formed, a silicide layer is formed on the surface of silicon in opening window $W_{FD}$. As a result, before the process of forming the silicide layer, opening window $W_{FD}$ is covered when silicide blocking layer 53 is formed. Then, the operation is performed in the same way as aforementioned. In addition, a solid-state image pickup device with substantially the same constitution as that shown in FIG. 4 can be manufactured in the same manufacturing process.

Figure 12:
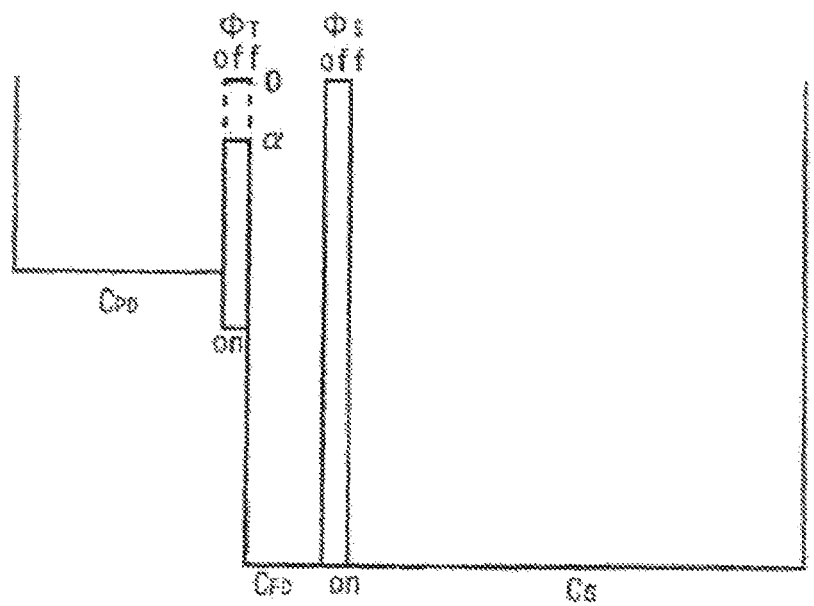
FIG. 12 is a schematic potential diagram corresponding to the photodiodes-accumulating capacitive elements of the CMOS image sensor in the embodiment of the present invention.

FIG. 12 is a schematic potential diagram corresponding to photodiode PD, transfer transistor Tr1, floating diffusion FD, accumulating transistor Tr2 and accumulating capacitive element $C_S$ in the solid-state image pickup device of the present embodiment.

Said photodiode PD forms capacitance $C_{PD}$ with a relatively shallow potential, and floating diffusion FD and accumulating capacitive element $C_S$ form capacitances ($C_{FD}$, $C_S$) with relatively deep potential. Here, the two levels for transfer transistor Tr1 and accumulating transistor Tr2 correspond to ON/OFF of the transistors.

In the following, the method of driving the CMOS image sensor in the present embodiment will be explained with reference to the equivalent circuit diagram shown in FIG. 1 and the position diagram shown in FIG. 12.

Figure 13:
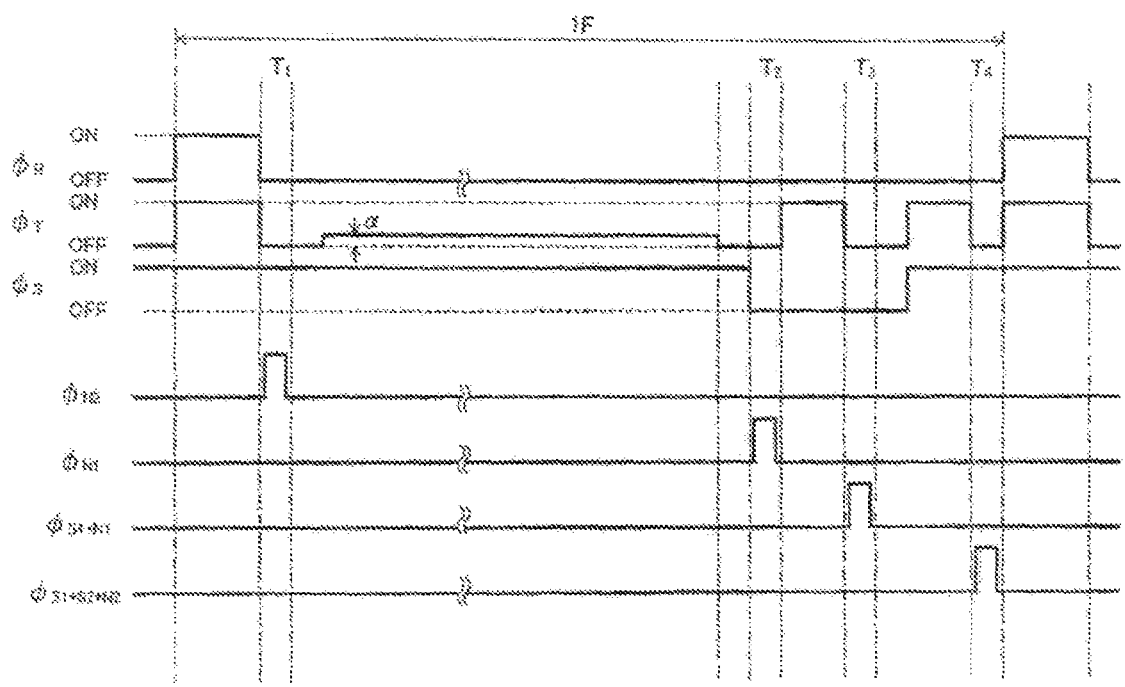
FIG. 13 is a time chart illustrating the ON/OFF 2-level of voltage applied to the driving lines of the CMOS image sensor pertaining to the embodiment of the present invention.

FIG. 13(A) is a time chart illustrating the ON/OFF 2-level state of the voltage applied to driving lines ϕT, ϕS, ϕR, and the 3-level state with level (+α) added to said two levels for ϕT.

Although the voltage applied to driving line φT can also be the two levels of ON/(+α), adopting the three levels as in this example makes it possible to have a larger maximum signal voltage at floating diffusion FD. When φT is driven with two levels, the OFF level shown in FIG. 13 can be taken as the (+α) level.

Also, FIGS. 14(A)-(C) and FIGS. 15(D)-(F) correspond to the potential diagrams in the various timing states of the time chart.

First of all, at the start of a field (1F), while φS is ON, φT, φR are ON, the photoelectric charge generated in the preceding field is entirely discharged and reset, and φR is turned OFF at time T1. Here, the level becomes (+α) for φT.

Figure 14:
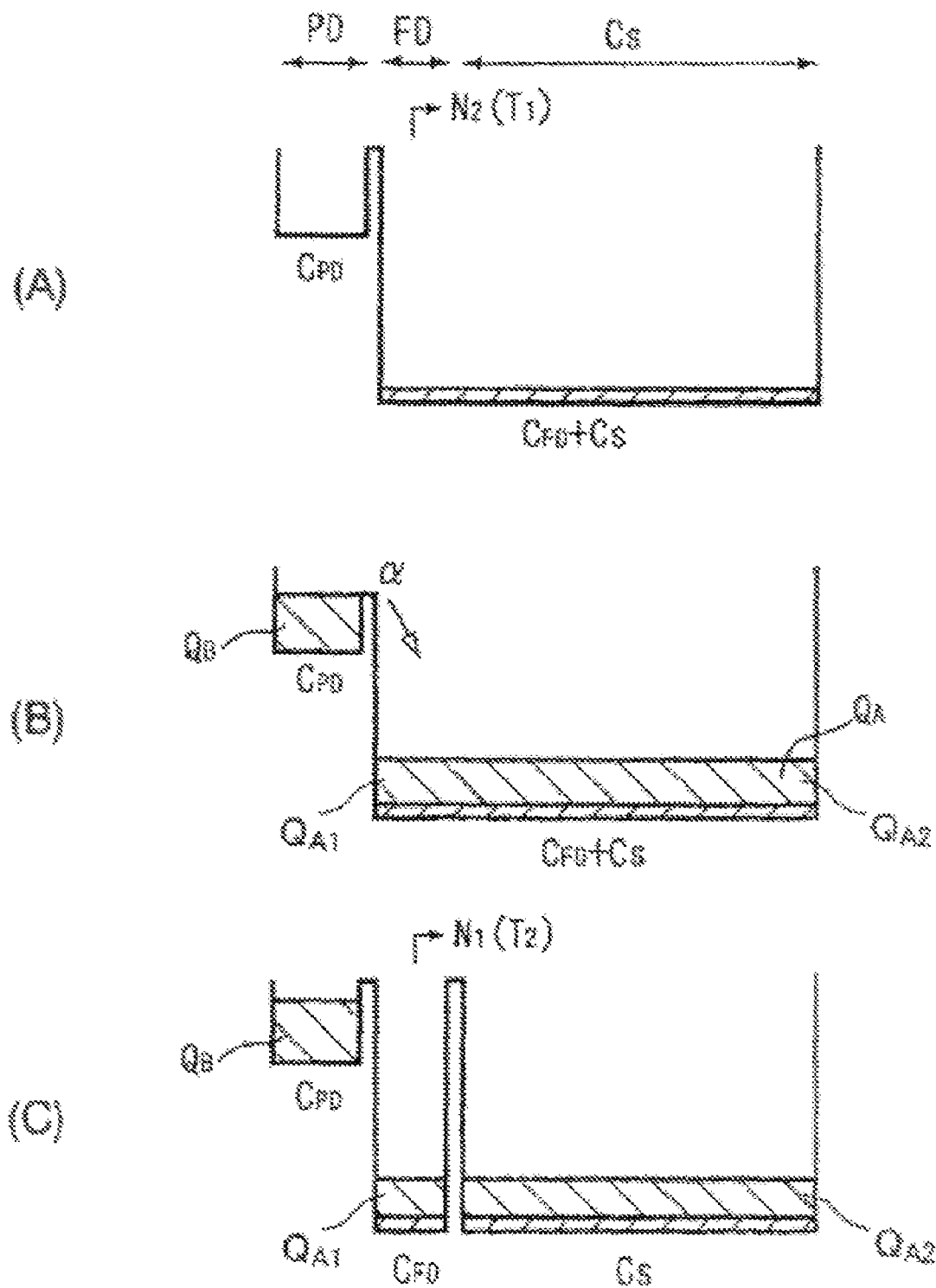
FIGS. 14(A)-(C) are schematic potential diagrams corresponding to the photodiodes-accumulating capacitive elements of the CMOS image sensor pertaining to the embodiment of the present invention.

In this case, as shown in FIG. 14(A), when φS is turned ON, $C_{FD}$ and $C_S$ are connected to each other, and immediately right after reset, taken into consideration the reset operation, so-called kTC noise is generated at $C_{FD}+C_S$. Here, as will be explained later, φN$_2$ is turned ON, and the signal at reset level of this $C_{FD}+C_S$ is read as noise N$_2$.

During the accumulating time started when φR is changed to OFF (T$_1$), the photoelectric charges generated accumulate in photodiode PD. At that time, for φT, the barrier between $C_{PD}$ and $C_{FD}$ as (+α) level is lowered slightly. When accumulation of the charges starts, the photoelectric charges are first accumulated in $C_{PD}$. When the quantity of photo-electrons exceeds the saturation quantity, as shown in FIG. 14(B), it goes over the barrier a little lower than (+α) level for φT, and the photoelectric charge overflows from CPD, and it is selectively accumulated in $C_{FD}+C_S$ of the pixel. In addition, when the photo-electron level is less than the saturation quantity for photodiode PD, the photoelectric charges accumulate only in $C_{PD}$. Then, when the photo-electron quantity exceeds the level for saturating photodiode PD, the photoelectric charges accumulate in $C_{FD}$ and $C_S$ in addition to $C_{PD}$.

FIG. 14(B) shows the state in which photodiode PD is saturated, before-saturation charge QB accumulates in $C_{PD}$, and over-saturation charge QA accumulates in $C_{FD}$ and $C_S$. Then, φT returns to the OFF state from (+α) level, and at time T2, φS is OFF, and as shown in FIG. 14(C), the potentials of $C_{FD}$ and $C_S$ are divided. At this time over-saturation charge QA is divided into QA1 and QA2 in response to the capacitance ration of $C_{FD}$ and $C_S$. Here, (pN$_1$ is turned ON, and the signal on the level of $C_{FD}$ holding a portion QA1 of the over-saturation charge is read as noise N$_1$.

Figure 15:
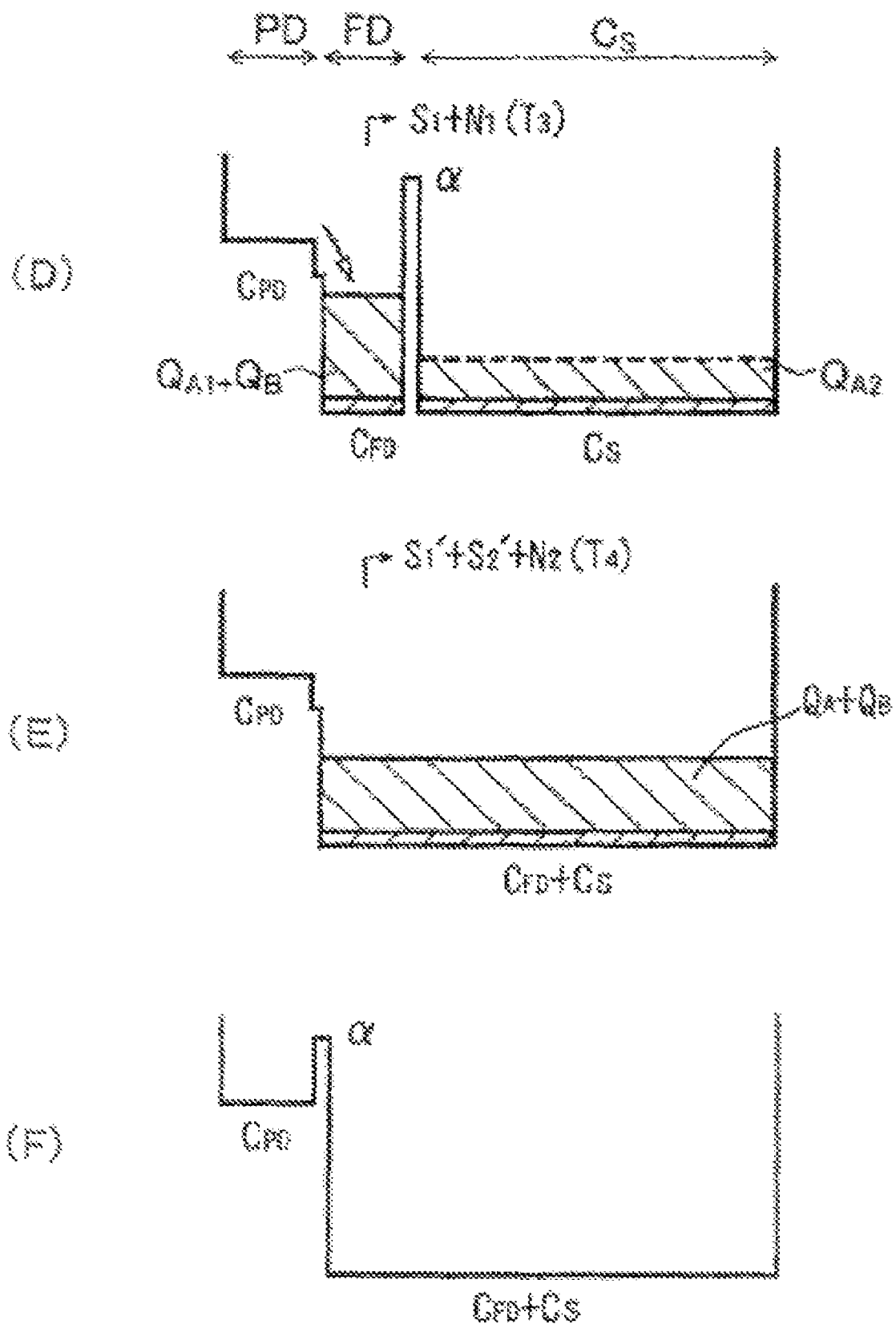
FIGS. 15(D)-(F) are schematic potential diagrams corresponding to the photodiodes—accumulating capacitive elements of the CMOS image sensor pertaining to the embodiment of the present invention.

Then, φT is turned ON, and as shown in FIG. 15(D), the before-saturation charge QB in $C_{PD}$ is transferred to $C_{FD}$, and it is combined with portion QA1 of the over-saturation charge that has been held in $C_{FD}$. Here, the potential of $C_{PD}$ is shallower than of $C_{FD}$, and the level of the transfer transistor is deeper than $C_{PD}$. As a result, all of before-saturation charge QB in $C_{PD}$ is transferred to $C_{FD}$. That is, charge transfer is completely realized.

Then, at time T3, φT is reset to OFF, φS$_1$+N$_1$ is turned ON, and before-saturation charge signal S$_1$ is read from before-saturation charge QB transferred to $C_{FD}$. However, the charge in $C_{FD}$ is a sum of before-saturation charge QB and a portion QA1 of the over-saturation charge, and what is actually read is S$_1$+N$_1$. FIG. 15(D) shows the state before φT is reset to OFF.

Then, φS, φT are turned ON, and the potentials of $C_{FD}$ and $C_S$ are coupled to each other. As shown in FIG. 15(E), the charge that is the sum of before-saturation charge QB and portion QA1 of the over-saturation charge in $C_{FD}$ is combined with portion QA2 of the over-saturation charge in $C_S$. Because the sum of a portion QA1 of the over-saturation charge and a portion QA2 of the over-saturation charge corresponds to the over-saturation charge before dividing, the potential with $C_{FD}$ and $C_S$ coupled to each other holds a signal that is the sum of before-saturation charge QB and the total over-saturation charge QA.

Here, at time T4, φT is reset to OFF, φS$_1$'+S$_2$'+N$_2$ is turned ON, and the signal of the sum of before-saturation charge signal S1 and over-saturation charge signal S$_2$ is read from before-saturation charge QB+over-saturation charge QA spread in $C_{FD}+C_S$. Here, however, because $C_{FD}+C_S$ noise rides on it and it is read from the charge spread in $C_{FD}+C$s, what is actually read is S$_1$'+S$_2$'+N$_2$ (where S$_1$' and S$_2$' are the values of S$_1$. and S$_2$ that are contracted and modulated according to the capacitance ratio of $C_{FD}$ and $C_S$). FIG. 15(E) shows the state before φT is reset to OFF. In this way, one field 1F comes to the ends and the next field begins. Then, while φS is ON, φT and φR are turned ON, and as shown in FIG. 15(F), all of the photoelectric charge generated in the preceding field is discharged, and it is then reset.

In the following, the overall circuit constitution of the CMOS image sensor with pixels of the aforementioned constitution integrated in an array configuration will be explained.

Figure 16:
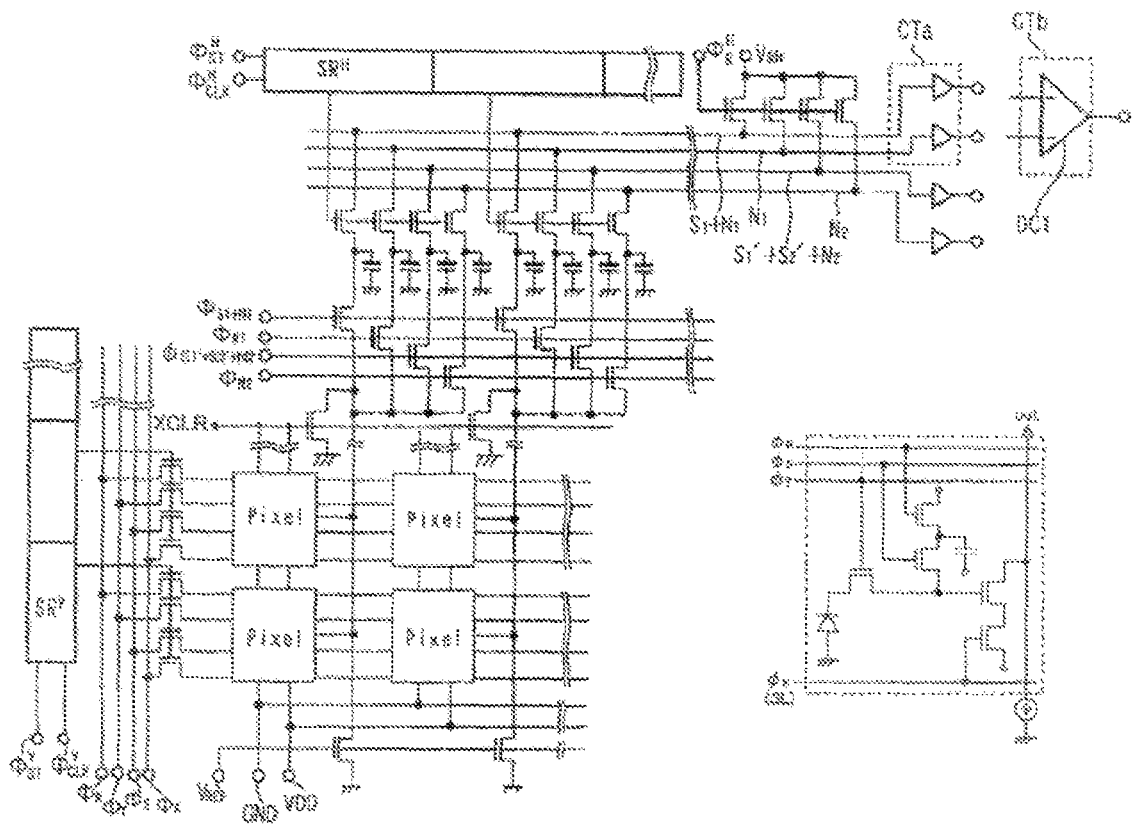
FIG. 16 is an equivalent circuit diagram illustrating the overall circuit constitution of the CMOS image sensor in the embodiment of the present invention.

FIG. 16 is an equivalent circuit diagram illustrating the overall circuit constitution of the CMOS image sensor in the present embodiment.

In this case, plural (four, shown as an example in the figure) pixels are arranged in an array configuration. Driving lines φT, φS, φR, φX controlled by row shift register SR$^V$, power source VDD, ground GNG, etc., are connected to the various pixels.

From the various pixels, under control of row shift register SR$^H$ and driving lines (φS$_1$+N$_1$, φN$_1$, φS$_1$'+S$_2$'+N$_2$, φN$^2$), as previously described, the four values of before-saturation charge signal (S$_1$)+$C_{FD}$ noise (N$_1$), $C_{FD}$ noise (N$_1$), modulated before-saturation charge signal (S$_1$')+modulated over-saturation charge signal (S$_2$')+$C_{FD}$+$C_S$ noise (N$_2$), and $C_{FD}$+$C_S$ noise (N$_2$) are output to the output lines at their respective timings. Here, as will be explained later, after the difference between before-saturation charge signal (S$_1$)+$C_{FD}$ noise (N$_1$) and $C_{FD}$ noise (N$_1$) is taken at the output terminal position CTa, circuit CTb containing differential amplifier DC1 may be formed on the CMOS image sensor chip.

Figure 17:
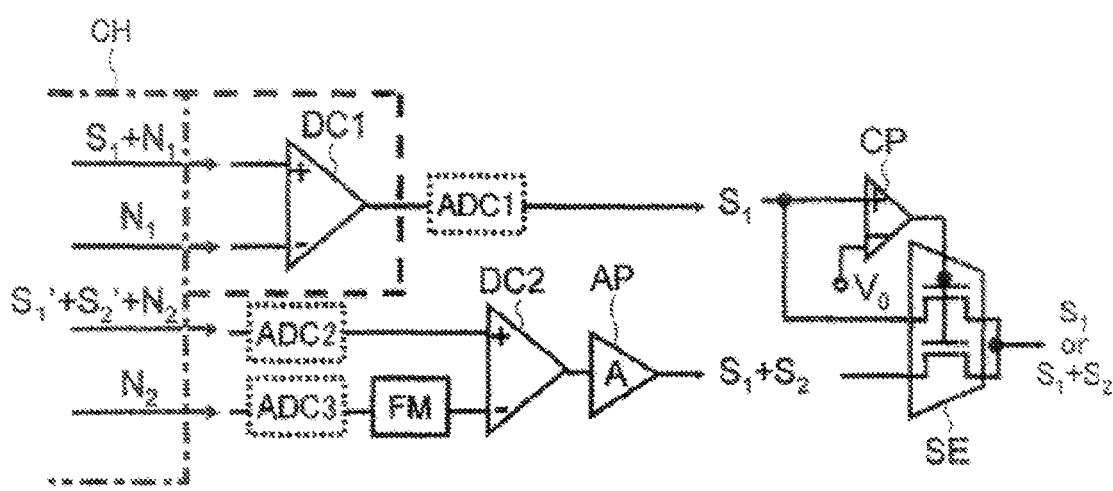
FIG. 17 is a diagram illustrating the circuit for processing the four signals, that is, before-saturation charge signal+$C_{FD}$ noise, $C_{FD}$ noise, modulated over-saturation charge signal+$C_{FD}+C_S$ noise, and $C_{FD}+C_S$ noise.

FIG. 17 shows the circuit for processing the four signals, that is, before-saturation charge signal (S$_1$)+$C_{FD}$ noise (N$_1$), $C_{FD}$ noise (N$_1$), modulated before-saturation charge signal (S$_1$')+modulated over-saturation charge signal (S$_2$')+$C_{FD}$+$C_S$ noise (N$_2$), and $C_{FD}$+$C_S$ noise (N$_2$).

From the aforementioned output, before-saturation charge signal (S$_1$)+$C_{FD}$ noise (N$_1$) and $C_{FD}$ noise (N$_1$) are input to differential amplifier DC1, and by taking their difference, $C_{FD}$ noise (N$_1$) is cancelled to obtain before-saturation charge signal (S$_1$). Also, before-saturation charge signal (S$_1$) can be digitized by A/D converter ADC1 provided as needed, and it can also be left in analog signal form as is, without providing ADC1.

On the other hand, modulated before-saturation charge signal (S$_1$')+modulated over-saturation charge signal (S$_2$')+$C_{FD}$+$C_S$ noise (N$_2$) and $C_{FD}$+$C_S$ noise (N$_2$) are input to differential amplifier DC2, and by taking their difference, $C_{FD}$+$C_S$ noise (N$_2$) is cancelled, and the signal is recovered by means of the capacitance ratio of $C_{FD}$ and Cs by amplifier AP to adjust the gain to match that of before-saturation charge signal (S$_1$) to obtain the sum of the before-saturation charge signal and over-saturation charge signal (S$_1$+S$_2$). Before input to differential amplifier DC2, the S$_1$'+S$_2$'+N$_2$ signal and N$_2$ signal can be digitized by A/D converters ADC2 and 3 provided as needed, respectively. They can also be input as is as analog signals to differential amplifier DC2, without providing ADC2, 3. Here, as shown in the time chart of FIG. 13, because $C_{FD}$+CS noise ($N_2$) is acquired before other signals, it is temporarily stored in frame memory FM as a storage means until other signals are acquired, and it is read from frame memory FM at the time of acquisition of the other signals, followed by the following processing.

In the following, recovery of said modulated before-saturation charge signal ($S_1'$)+modulated over-saturation charge signal ($S_2'$) will be explained.

$S_1'$, $S_2'$, $\alpha$ (charge distribution ratio from $C_{FD}$ to $C_{FD}+C_S$) are represented by the following formulas.

$$S_1' = S_1 \times \square \quad (1)$$

$$S_2' = S_2 \times \square \quad (2)$$

$$\square_1' = C_{FD}/C_{FD}+C_S \quad (3)$$

Consequently, from the values of $C_{FD}$ and $C_S$, a is determined using the above Equation 3, and by substitution into said equations 1 and 2, $S_1+S_2$ is recovered, and can be adjusted to the same gain as that of $S_1$ acquired elsewhere.

Then, as shown in FIG. 17, either $S_1$ or $S_1+S_2$ acquired above is selected to be the final output. Here also, $S_1$ is input to comparator CP to be compared with preset reference potential $V_0$. On the other hand, $S_1$ and $S_1+S_2$ are input to selector SE, and either $S_1$ or $S_1+S_2$ is selected and output according to the output of said comparator CP. Reference potential $V_0$ is selected as the potential before saturation corresponding to the capacitance of photodiode PD. For example, it can be about 0.3 V. That is, when the result obtained by subtracting $V_0$ from $S_1$ is negative, that is, when $S_1$ is smaller than $V_0$, it is judged that photodiode PD is not saturated, and $S_1$ is output.

On the contrary, if the result obtained by subtracting $V_0$ from $S_1$ is positive, that is, when $S_1$ is larger than $V_0$, it is judged that photodiode PD is saturated, and $S_1+S_2$ is output. For example, the circuit up to this output is formed on CMOS image sensor chip CH, and it is realized by externally attaching differential amplifier DC1 and the circuit after frame memory FM. Also, as explained above, differential amplifier DC1 may also be formed on CMOS image sensor chip CH.

Also, with regard to differential amplifier DC1 and the circuit after frame memory FM, taking into consideration the fact that the handled analog data are large, it is preferred that A/D conversion be performed before input to differential amplifier DC1 and frame memory FM, and digital processing be performed after differential amplifier DC1 and frame memory FM. In this case, it is preferred that amplification be performed by means of an amplifier, not shown in the figure, matching the input range of the A/D converter in use.

As explained above, for each pixel in the CMOS image sensor of the present embodiment, two signals, that is, before-saturation charge signal ($S_1$) and the sum of before-saturation charge signal and over-saturation charge signal ($S_1+S_2$) are obtained for each field. A judgment is made as to whether photodiode PD (CPD) is actually saturated or nearly saturated, and a selection is made between $S_1$ and $S_1+S_2$.

Figure 18:
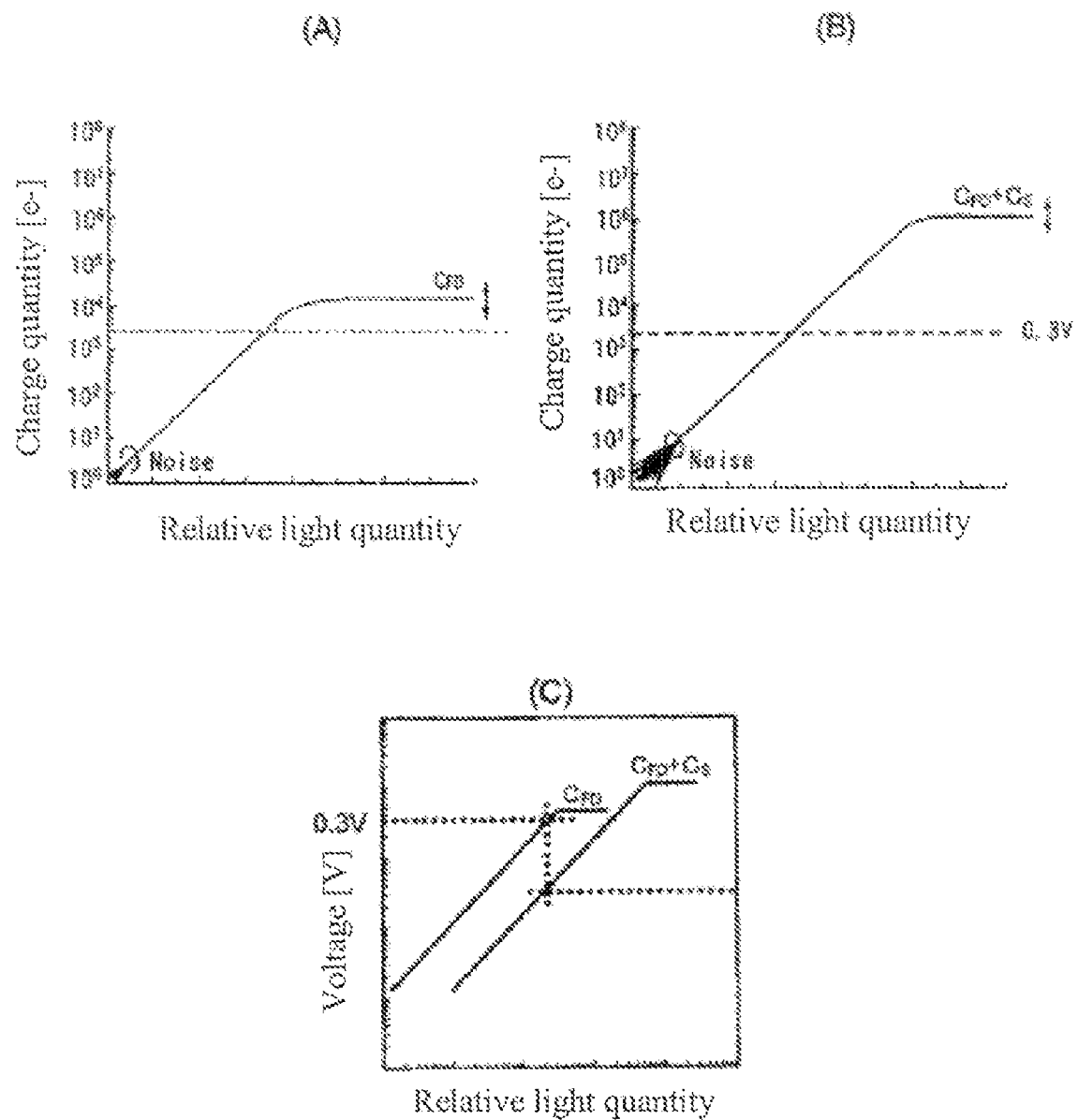
FIGS. 18(A) and 18(B) are diagrams illustrating the charge quantity versus relative light quantity obtained when capacitance $C_{FD}$ or capacitance $C_{FD}+C_S$ is used.
FIG. 18(C) is a diagram illustrating the charge quantities shown in FIGS. 18(A) and 18(B) converted to voltages versus relative light quantity, superimposed on each other.

FIG. 18(A) is a diagram illustrating the quantity of charge obtained using capacitance $C_{FD}$ as aforementioned versus the relative light quantity. It corresponds to signal $S_1$. On the other hand, FIG. 18(B) is a diagram illustrating the quantity of charge obtained using capacitance $C_{FD}+C_S$ versus the relative light quantity. This corresponds to signal $S_1+S_2$.

For example, as reference potential $V_0$ (for example, 0.3 V), signal $S_1$ shown in FIG. 18(A) is used on the lower illuminance side with respect to it, and signal $S_1+S_2$ shown in FIG. 18(B) is used on the higher illuminance side. In this case, noise Noise appears in the two graphs in the lower illuminance side. However, because signal $S_1$ is smaller than signal $S_1+S_2$, and signal S1 is adopted on the lower illuminance side, there is no problem of a high noise level.

Also, there is variation in each pixel for the saturated potential of $C_{FD}$, and the variation in the charge quantity is about $1 \times 10^4$-$2 \times 10^4$. However, because a switch is made to signal $S_1+S_2$ using $C_{FD}+C_S$ before entering this region, there is no influence from the variation of the saturated potential of $C_{FD}$. This is an advantage.

Also, for example, even when reference potential $V_0$ is variable, because the charge quantity of $C_{FD}$ and the charge quantity of $C_{FD}+C_S$ are in agreement with each other near the reference potential, there are no problems at potentials near the reference potential when signal $S_1$ is used or when signal $S_1+S_2$ is used.

FIG. 18(C) is a diagram superimposing the plot of the voltage of the floating diffusion when capacitance $C_{FD}$ shown in FIG. 18(A) is used, versus the relative light quantity (represented by $C_{FD}$), and the plot of the voltage of the floating diffusion when capacitance $C_{FD}+C_S$ shown in FIG. 18(B) is used, versus the relative light quantity (represented by $C_{FD}+C_S$), superimposed on each other. The graphs shown in FIGS. 18(A) and 18(B) correspond to the conversion from charge quantity to voltage.

When capacitance $C_{FD}+C_S$ is used, although the same charge quantity is obtained when irradiated with the same light quantity, because the partial capacitance of $C_S$ is larger, the converted voltage becomes correspondingly lower. For example, signal $S_1$ of the graph represented by $C_{FD}$ is used on the lower illuminance side until the reference potential exceeds 0.3 V, and it is switched to signal $S_1+S_2$ of the graph represented by $C_{FD}+C_S$ on the higher illuminance side over 0.3 V.

In the solid-state image pickup device with a wide dynamic range of the present embodiment, the structure in at least one of said source/drain regions that form the accumulating transistor is such that the depletion layer that extends from the joint plane when the solid-state image pickup device is turned ON does not reach the side surface of the element separating insulating film. As a result, it is possible to suppress the dark current component with respect to the photo-electrons overflowing from the photodiode.

The present invention is not limited to the aforementioned explanation. For example, a case has been explained in which there are five transistors for each pixel of the CMOS sensor. However, it can also be adopted for CMOS sensors having more than this number of transistors.

In addition, various modifications can be adopted as long as the gist of the present invention is observed. The solid-state image pickup device of the present invention can be adopted in image sensors that should have a wide dynamic range, such as CMOS image sensors, CCD image sensors, etc., carried in digital cameras, cell phones with built in cameras, etc. The method of manufacturing the solid-state image pickup device of the present invention can be adopted in manufacturing image sensors that need to have a wide dynamic range.

The invention claimed is:

1. A solid-state image pickup device comprising:
   a plurality of pixels integrated in an array configuration on a semiconductor substrate; each pixel having the following parts:
   a photodiode that receives light and generates and accumulates photoelectric charge,
   a transfer transistor that transfers said photoelectric charge from said photodiode, a floating diffusion to which said photoelectric charge is transferred via said transfer transistor;

an accumulating capacitive element that is connected to said photodiode via said transfer transistor, and that accumulates the photoelectric charge overflowing from said photodiode via said transfer transistor in the accumulating operation;

and an accumulating transistor that connects or divides the potentials of said floating diffusion and said accumulating capacitive element, with one source/drain region becoming said floating diffusion and with another source/drain region being connected to said accumulating capacitive element;

in at least one of said source/drain regions that form said accumulating transistor, there are the following layers:

a first semiconductor layer of the first electroconductive type that is formed in an active region of said semiconductor substrate and is divided by the element separating insulating film;

a second semiconductor layer of the first electroconductive type formed in said first semiconductor layer such that at least a side surface of said element separating insulating film is covered; and a third semiconductor layer of the second electroconductive type formed on an outer layer portion of said first semiconductor layer so that a joint plane is formed with said second semiconductor layer whereby when said solid-state image pickup device is turned ON, the depletion layer extending from said joint plane does not reach the side surface of said element separating insulating film.

2. The solid-state image pickup device described in claim 1 further comprising in each said pixel a gate electrode for the amplifying transistor is connected to said floating diffusion, and the amplifying transistor is formed with a side wall insulating film applied to the side portion of said gate electrode for the amplifying transistor;

and wherein in at least one of said source/drain regions that form said accumulating transistor, there is a first insulating layer formed on the upper layer of said second semiconductor layer and said third semiconductor layer;

a second insulating layer formed on the upper layer of said first insulating layer, a contact hole that passes through said first insulating layer and said second insulating layer to reach said third semiconductor layer;

an electroconductive layer formed connected to said semiconductor substrate in said contact hole;

an the end portion of the depletion layer that when said solid-state image pickup device is turned ON extends from said joint plane at the interface between said second semiconductor layer, as well as said third semiconductor layer, and said first insulating film is covered with said first insulating film;

and wherein said first insulating layer is formed of the same insulating material as that of said side wall insulating film.

3. The solid-state image pickup device described in claim 2 wherein said first insulating film has an opening with diameter larger than said contact hole formed in it, and said second insulating film is composed of plural insulating films.

4. The solid-state image pickup device described in claim 2 further comprising:

a reset transistor that is connected to said floating diffusion for discharging the photoelectric charge in said floating diffusion.

5. The solid-state image pickup device described in claim 1 further comprising: a reset transistor that is connected to said accumulating capacitive element for discharging the photoelectric charge in said accumulating capacitive element.

6. The solid-state image pickup device described in claim 1 further comprising:

a selecting transistor that is connected in series to said amplifying transistor, and the selecting transistor has a gate electrode for selecting said pixel, and wherein said side wall insulating film is also formed on the side portion of the selecting transistor gate electrode.

7. A method of manufacturing a solid-state image pickup device characterized by the comprising:

solid-state image pickup device having plural pixels integrated in an array configuration on a semiconductor substrate; each pixel has the following parts: a photodiode that receives light and generates and accumulates photoelectric charge, a transfer transistor that transfers said photoelectric charge from said photodiode, a floating diffusion to which said photoelectric charge is transferred via said transfer transistor, an accumulating capacitive element that is set via said transfer transistor to said photodiode and that accumulates the photoelectric charge overflowing from said photodiode via said transfer transistor in the accumulating operation, and an accumulating transistor that connects or divides the potentials of said floating diffusion and said accumulating capacitive element, with one source/drain region becoming said floating diffusion and with the other source/drain region being connected to said accumulating capacitive element comprising:

forming an element separating insulating film for dividing the active region in the first semiconductor layer of the first electroconductive type of said semiconductor substrate;

forming second semiconductor layer of the first electroconductive type in contact with said element separating insulating film in said first semiconductor layer such that its shape covers at least a side surface of said element separating insulating film; and forming a third semiconductor layer of the second electroconductive type such that a joint plane is formed on the outer layer portion of said first semiconductor layer between it and said second semiconductor layer;

wherein at least one of said source/drain regions that form said accumulating transistor is formed such that the depletion layer that extends from said joint plane when said solid-state image pickup device is turned ON does not reach the side surface of said element separating insulating film.

8. The method of manufacturing a solid-state image pickup device described in claim 7 wherein the amplifying transistor gate electrode for each said pixel of the solid-state image pickup device is connected to said floating diffusion, and the amplifying transistor is formed with a side wall insulating film formed on the side portion of said amplifying transistor gate electrode; and further comprising formation of the third semiconductor layer:

forming a first insulating layer on the upper layer of said second semiconductor layer and said third semiconductor layer;

forming a second insulating layer on the upper layer of said first insulating layer;

forming a contact hole that passes through said first insulating layer and said second insulating layer to reach said third semiconductor layer;

forming an electroconductive layer is formed connected to said semiconductor substrate in said contact hole;

wherein said step in which said first insulating film is formed, an insulating film serving as said side wall insulating film is simultaneously formed in the region for forming said selecting transistor, and wherein the end portion of the depletion layer that when said solid-state image pickup device is turned ON extends from said joint plane at the interface between said second semiconductor layer, as well as said third semiconductor layer, and said first insulating layer is covered with said first insulating film in the structure.

9. The method of manufacturing a solid-state image pickup device described in claim 8 wherein the fact in the method of manufacturing a solid-state image pickup device that also has a selecting transistor that is connected in series with said amplifying transistor and has a selecting transistor gate electrode for selecting said pixel, in the step in which said first insulating film is formed, an insulating film serving as said side wall insulating film is also formed simultaneously in the region of formation of said selecting transistor.

10. The method of manufacturing a solid-state image pickup device described in claim 8 wherein after said step in which said first insulating film is formed and before said step of formation of said second insulating film, there is also a step in which said first insulating film has an opening with a larger diameter than that of said contact hole formed in and in said step of formation of said second insulating film, plural insulating films are formed as said second insulating film.

* * * * *